US012776479B2

(12) United States Patent
Akama et al.

(10) Patent No.: US 12,776,479 B2
(45) Date of Patent: Oct. 27, 2026

(54) SUBSTRATE TREATMENT SYSTEM

(71) Applicant: Tokyo Electron Limited, Tokyo (JP)

(72) Inventors: Toshiki Akama, Miyagi (JP); Shusei Kato, Miyagi (JP); Gyeong min Park, Miyagi (JP); Nobutaka Sasaki, Miyagi (JP); Takashi Aramaki, Miyagi (JP); Lifu Li, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 19/093,300

(22) Filed: Mar. 28, 2025

(65) Prior Publication Data

US 2025/0226189 A1 Jul. 10, 2025

Related U.S. Application Data

(63) Continuation of application No. PCT/JP2023/034826, filed on Sep. 26, 2023.

(30) Foreign Application Priority Data

Sep. 30, 2022 (JP) ................................ 2022-157677

(51) Int. Cl.
*H01J 37/20* (2006.01)
*H01J 37/32* (2006.01)

(52) U.S. Cl.
CPC .. *H01J 37/32697* (2013.01); *H01J 37/32449* (2013.01); *H01J 37/32642* (2013.01);
(Continued)

(58) Field of Classification Search
CPC ........... H01J 37/32697; H01J 37/32449; H01J 37/32642; H01J 37/32834; H01J 37/32853; H01J 2237/334
See application file for complete search history.

(56) References Cited

U.S. PATENT DOCUMENTS

2019/0355611 A1* 11/2019 Kim ........................ H01J 37/20
2023/0215753 A1 7/2023 Amikura et al.

FOREIGN PATENT DOCUMENTS

JP 2004-047512 A 2/2004
JP 2010-272709 A 12/2010
(Continued)

OTHER PUBLICATIONS

International Search Report and Written Opinion mailed on Dec. 12, 2023, received for PCT Application PCT/JP2023/034826, filed on Sep. 26, 2023, 9 pages including English Translation.

*Primary Examiner* — Jimmy T Vu
(74) *Attorney, Agent, or Firm* — XSENSUS LLP

(57) ABSTRACT

A substrate processing system comprising: a plasma processing apparatus; a depressurization transfer device having a transfer robot and an edge ring; and a controller is disclosed. The plasma processing apparatus includes: a depressurizable processing chamber; a substrate support table; a lifting mechanism; a gas supply part; and a plasma generating part. The controller controls following steps to be performed in following order: (a) performing plasma processing on the substrate and, then, applying a voltage of a first polarity to the electrode; (b) neutralizing the edge ring, by applying a voltage of a second polarity to the electrode while supplying a gas, and stopping the application of the voltage to the electrode after a predetermined period of time elapses; (c) separating the edge ring from a ring placing surface of the substrate support table; and (d) transferring the edge ring from the processing chamber to the depressurization pressure transfer device.

15 Claims, 15 Drawing Sheets

(52) U.S. Cl.
CPC .. *H01J 37/32834* (2013.01); *H01J 37/32853* (2013.01); *H01J 2237/334* (2013.01)

(56) References Cited

FOREIGN PATENT DOCUMENTS

| | | | |
|---|---|---|---|
| JP | 2018-010992 | A | 1/2018 |
| JP | 2021-010026 | A | 1/2021 |
| WO | 2022/172827 | A1 | 8/2022 |

* cited by examiner

SUBSTRATE TREATMENT SYSTEM

CROSS-REFERENCE TO RELATED APPLICATIONS

This application is a bypass continuation application of International Application No. PCT/JP2023/034826 having an international filing date of Sep. 26, 2023 and designating the United States, the International Application being based upon and claiming the benefit of priority from Japanese Patent Application No. 2022-157677 filed on Sep. 30, 2022, the entire contents of each are incorporated herein by reference.

TECHNICAL FIELD

The present disclosure relates to a substrate processing system.

BACKGROUND

Japanese Laid-open Patent Publication No. 2018-10992 discloses a focus ring replacement method for replacing a focus ring placed on a placing table to surround the periphery of a substrate placed on a placing table provided in a processing chamber, which is used in a plasma processing apparatus capable of performing plasma processing on the substrate. The replacement method includes an unloading step of unloading the focus ring from the processing chamber by a transfer device for transferring the focus ring without opening the processing chamber to the atmosphere, and, after the unloading step, a cleaning step of cleaning the surface of the placing table on which the focus ring is placed. The replacement method further includes, after the cleaning step, a loading step of loading the focus ring into the processing chamber by the transfer device without opening the processing chamber to the atmosphere and placing the focus ring on the placing table. Further, Japanese Laid-open Patent Publication No. 2018-10992 discloses that, when the focus ring is attached to the placing table by an electrostatic chuck, a neutralization process is performed until the unloading step.

SUMMARY

The technique of the present disclosure suppresses damage to a mechanism for moving an edge ring in the case of separating the edge ring electrostatically attracted to a substrate support table from the substrate support table and unloading the edge ring to the outside of the processing chamber using the mechanism.

A substrate processing system, comprising: a plasma processing apparatus; a depressurization transfer device connected to the plasma processing apparatus and having a transfer robot configured to transfer a substrate and an edge ring; and a controller, is provided. The plasma processing apparatus includes: a depressurizable processing chamber; a substrate support table disposed in the processing chamber, and including an electrostatic chuck having a substrate placing surface, a ring placing surface on which the edge ring is placed to surround the substrate placing surface, and an electrode that attracts the edge ring on the ring placing surface; a lifting mechanism configured to raise and lower the edge ring with respect to the ring placing surface; a gas supply part configured to supply a gas into the processing chamber; and a plasma generating part configured to generate plasma in the processing chamber. The controller controls following steps to be performed in following order: (a) performing plasma processing on the substrate and, then, applying a voltage of a first polarity to the electrode; (b) neutralizing the edge ring, by applying a voltage of a second polarity different from the first polarity applied to the electrode in the step (a) to the electrode while supplying the gas from the gas supply part into the processing chamber, and stopping the application of the voltage to the electrode after a predetermined period of time elapses: (c) separating the edge ring from the ring placing surface by the lifting mechanism; and (d) transferring the edge ring from the processing chamber to the depressurization pressure transfer device by the transfer robot.

DETAILED DESCRIPTION

Figure 1:
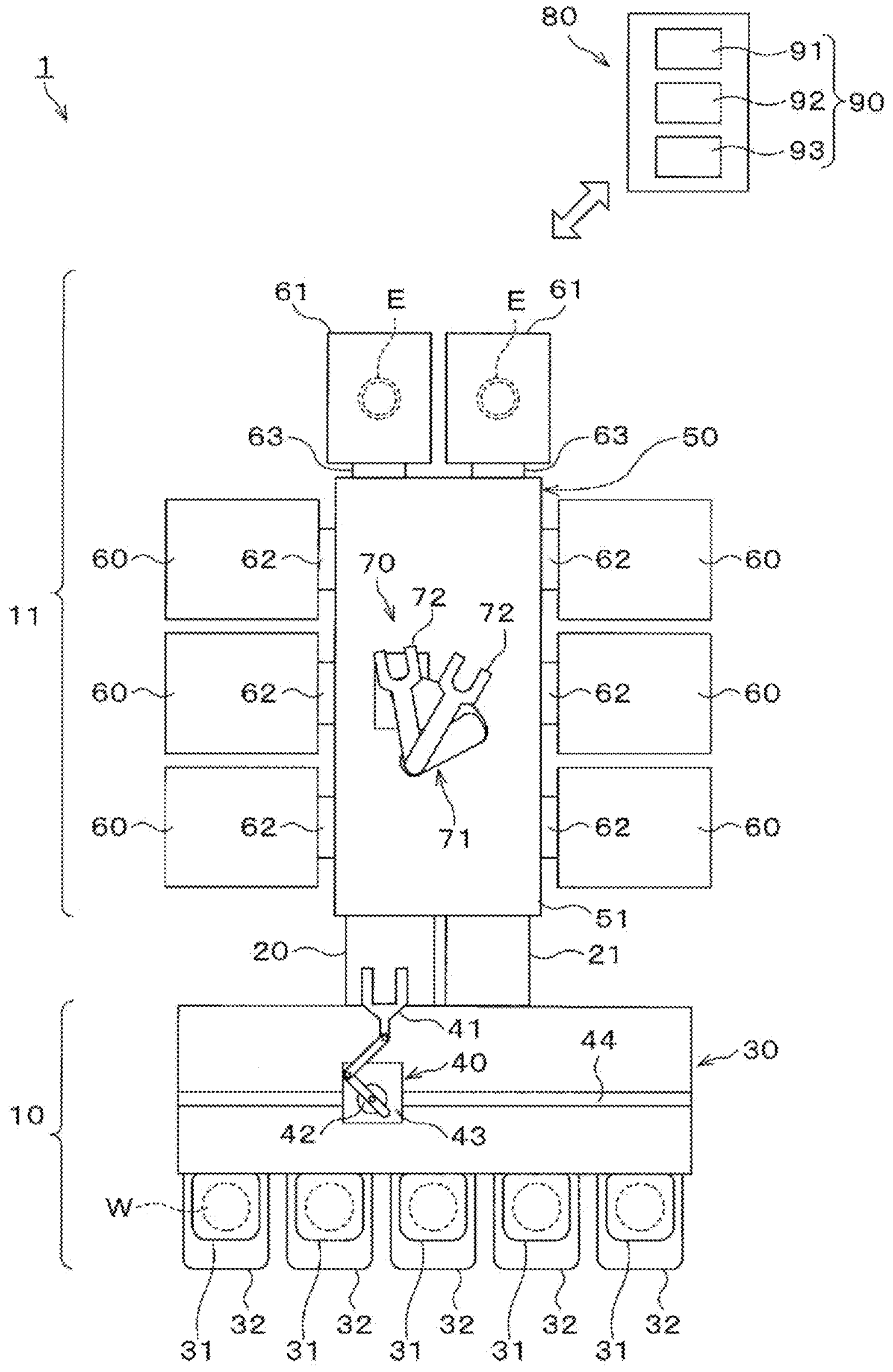
FIG. 1 is a plan view schematically showing a configuration of a plasma processing system as a substrate processing system according to an embodiment.

In a manufacturing process of semiconductor devices or the like, substrate processing, such as etching using plasma, i.e., plasma processing, is performed on a substrate such as a semiconductor wafer (hereinafter, referred to as "wafer"). The plasma processing is performed in a state where the substrate is placed on a substrate support table in a depressurized processing chamber.

In addition, in order to obtain satisfactory and uniform plasma processing results at the center and the periphery of the substrate, an annular member in plan view, which is referred to as a focus ring, an edge ring, or the like (hereinafter referred to as "edge ring"), may be placed on the substrate support table to surround the periphery of the substrate on the substrate support table.

Further, since the plasma processing results depend on the temperature of the substrate, the temperature of the substrate support table is adjusted during the plasma processing, and the temperature of the substrate is adjusted via the substrate support table.

When the above-described edge ring is used, the temperature of the edge ring affects the plasma processing results at the periphery of the substrate, so that the temperature adjustment of the edge ring is also important. Therefore, the temperature of the edge ring is also adjusted via the substrate support table.

However, simply placing the substrate and the edge ring on the substrate support table results in a vacuum insulation layer formed between the substrate support table and the substrate and the edge ring and, therefore, it is not possible to appropriately perform the temperature adjustment via the substrate support table.

In order to improve the above-described drawback, an electrostatic chuck is provided on the substrate support table, and the substrate and the edge ring are electrostatically attracted to the electrostatic chuck.

In addition, the edge ring is etched and worn out by exposure to plasma, and thus needs to be replaced. When the edge ring is worn out, it is generally replaced by an operator in a state where the processing chamber is opened to the atmosphere. However, it is also considered to use a mechanism for moving the edge ring to replace the edge ring without opening the processing chamber to the atmosphere (see Japanese Laid-open Patent Publication No. 2018-10992).

In the case of replacing the edge ring as described above, the mechanism for moving the edge ring may be damaged when the edge ring is separated from the substrate support table on which the electrostatic chuck is provided. Specifically, even after the application of voltage to the electrode of the electrostatic chuck is stopped, the edge ring continues to be strongly attracted to the substrate support table electrostatically. As a result, when the edge ring is raised by a lifting mechanism for raising and lowering the edge ring and separated from the substrate support table, the lifting mechanism may be damaged. In addition, since the edge ring has reached a high temperature during the plasma processing, a transfer robot for receiving the edge ring from the lifting mechanism and unloading the edge ring to the outside of the processing chamber may be damaged.

Therefore, the technique of the present disclosure suppresses damage to the mechanism for moving the edge ring when the mechanism is being used for separating the edge ring electrostatically attracted to the substrate support table from the substrate support table and unloading the edge ring to the outside of the processing chamber.

Hereinafter, the substrate processing system according to the present embodiment will be described with reference to the accompanying drawings. Further, in this specification and the drawings, like reference numerals will be used for like parts having substantially the same functional configuration, and redundant description thereof will be omitted.

<Plasma Processing System>

FIG. 1 is a plan view schematically showing a configuration of a plasma processing system as a substrate processing system according to the present embodiment.

In a plasma processing system 1 of FIG. 1, a wafer W as a substrate is processed. Specifically, the wafer W is subjected to substrate processing, such as etching using plasma, i.e., plasma processing.

The plasma processing system 1 includes an atmospheric part 10 and a depressurization part 11. The atmospheric part 10 and the depressurization part 11 are integrally connected via load-lock modules 20 and 21. The atmospheric part 10 has an atmospheric module for performing desired processing on the wafer W in an atmospheric atmosphere. The depressurization part 11 has a depressurization module for performing desired processing on the wafer W in a depressurized atmosphere (vacuum atmosphere).

The load-lock modules 20 and 21 are provided to connect a loader module 30 included in the atmospheric part 10 and a transfer module 50 included in the depressurization part 11 via gate valves (not shown). The load-lock modules 20 and 21 are configured to temporarily hold the wafer W. Further, the load-lock modules 20 and 21 are configured such that the inner atmospheres thereof are switched between an atmospheric atmosphere and a depressurized atmosphere.

The atmospheric part 10 has the loader module 30 provided with a transfer mechanism 40 to be described later, and a load port 32 on which a front opening unified pod (FOUP) 31 is placed. The FOUP 31 is capable of storing a plurality of wafers W. Further, the loader module 30 may be connected to an orienter module (not shown) for adjusting the horizontal orientation of the wafer W, a buffer module (not shown) for temporarily storing a plurality of wafers W, and the like.

The loader module 30 has a rectangular housing therein, and the housing is maintained in an atmospheric atmosphere. A plurality of, e.g., five, load ports 32 are arranged side by side on one side surface constituting the longitudinal side of the housing of the loader module 30. The load-lock modules 20 and 21 are arranged side by side on the other side surface constituting the longitudinal side of the housing of the loader module 30.

The transfer mechanism 40 configured to hold and transfer the wafer W is provided in the housing of the loader module 30. The transfer mechanism 40 has a transfer arm 41 for supporting the wafer W during transfer, a rotatable table 42 for rotatably supporting the transfer arm 41, and a base 43 on which the rotatable table 42 is placed. Further, a guide rail 44 extending in the longitudinal direction of the loader module 30 is provided in the loader module 30. The base 43 is provided on the guide rail 44, and the transfer mechanism 40 is configured to be movable along the guide rail 44.

The depressurization part 11 includes a transfer module 50 as a depressurization transfer device, a processing module 60 as a plasma processing apparatus, and a storage module 61 as a storage part. The inner atmospheres of the transfer module 50 and the processing module 60 (specifically, the inner atmospheres of a depressurization transfer chamber 51 and the chamber 100 to be described later) are maintained in a depressurized atmosphere, and the inner atmosphere of the storage module 61 is also maintained in a depressurized atmosphere. A plurality of, e.g., six, processing modules 60, and a plurality of, e.g., two, storage modules 61 are provided for one transfer module 50. The number and arrangement of the processing modules 60 may be set arbitrarily without being limited to those in the present embodiment, and at least one processing module provided with a wafer support table to be described later may be provided. Further, the number and arrangement of the storage modules 61 may be set arbitrarily without being limited to those in the present embodiment. For example, at least one storage module is provided.

The transfer module 50 is configured to transfer the wafer W therein. Further, the transfer module 50 is configured to transfer an edge ring E to be described later.

The transfer module 50 includes the depressurization transfer chamber 51 having a housing formed in a polygonal shape in plan view (quadrilateral shape in plan view in the illustrated example), and the depressurization transfer chamber 51 is connected to the load-lock modules 20 and 21.

The transfer module 50 transfers the wafer W loaded into the load-lock module 20 to one processing module 60, and transfers the wafer W that has been subjected to desired plasma processing in the processing module 60 to the load-lock module 21.

Further, the transfer module 50 may transfer the edge ring E in the storage module 61 to one processing module 60, and may transfer the edge ring E in the processing module 60 to the storage module 61 at the same time.

The processing module 60 performs desired plasma processing, such as etching, on the wafer W transferred from the transfer module 50. The processing module 60 is connected to the transfer module 50 via a gate valve 62. Further, the specific configuration of the processing module 60 will be described later.

The storage module 61 stores the edge ring E. The storage module 61 is connected to the transfer module 50 via a gate valve 63.

A transfer robot 70 is provided in the depressurization transfer chamber 51 of the transfer module 50. The transfer robot 70 is configured to be able to hold and transfer the wafer W. The transfer robot 70 is configured to be able to hold and transfer the edge ring E.

The transfer robot 70 has a transfer arm 71 configured to be able to rotate, extend, and move up and down while holding the wafer W. The tip end of the transfer arm 71 is branched into two forks 72 as holding parts. The forks 72 are configured to be able to hold the wafer W and the edge ring E to be transferred.

In the transfer module 50, the transfer arm 71 receives the wafer W held in the load-lock module 20 and loads the wafer W into the processing module 60. Further, the transfer arm 71 receives the wafer W that has been subjected to desired processing in the processing module 60 and transfers the wafer W to the load-lock module 21.

Further, in the transfer module 50, the transfer arm 71 may receive the edge ring E in the storage module 61 and loads the edge ring E into the processing module 60. Further, in the transfer module 50, the transfer arm 71 may receive the edge ring E in the processing module 60 and transfers the edge ring E to the storage module 61.

Further, the plasma processing system 1 includes a controller 80. In one embodiment, the controller 80 processes computer-executable instructions that cause the plasma processing system 1 to perform various steps described in the present disclosure. The controller 80 may be configured to control individual components of the plasma processing system 1 to perform various steps described herein. In one embodiment, the controller 80 may be partially or entirely included in individual components of the plasma processing system 1. The controller 80 may include, e.g., a computer 90. The computer 90 may include, e.g., a processing part (central processing unit (CPU)) 91, a storage part 92, and a communication interface 93. The processing part 91 may be configured to perform various control operations and calculations based on a program stored in the storage part 92. The storage part 92 may include a random access memory (RAM), a read only memory (ROM), a hard disk drive (HDD), a solid state drive (SSD), or a combination thereof. The communication interface 93 may communicate with individual components of the plasma processing system 1 via a communication line such as a local area network (LAN).

<Wafer Processing in Plasma Processing System 1>

Next, an example of wafer processing using the plasma processing system 1 configured as above will be described.

First, the wafer W is taken out of a desired FOUP 31 by the transfer mechanism 40 and transferred into the load-lock module 20. Next, the inside of the load-lock module 20 is sealed and depressurized. Thereafter, the inside of the load-lock module 20 and the inside of the transfer module 50 communicate with each other.

Then, the wafer W is held by the transfer robot 70 and transferred from the load-lock module 20 to the transfer module 50.

Thereafter, the gate valve 62 corresponding to the desired processing module 60 is opened, and the wafer W is transferred into the desired processing module 60 by the transfer robot 70. Next, the gate valve 62 is closed, and the desired processing is performed on the wafer W in the processing module 60. The processing performed on the wafer W in the processing module 60 will be described later.

Then, the gate valve 62 is opened, and the wafer W is unloaded from the processing module 60 by the transfer robot 70. Thereafter, the gate valve 62 is closed.

Next, the wafer W is loaded into the load-lock module 21 by the transfer robot 70. When the wafer W is loaded into the load-lock module 21, the inside of the load-lock module 21 is sealed and opened to the atmosphere. Then, the inside of the load-lock module 21 and the inside of the loader module 30 communicate with each other.

Then, the wafer W is held by the transfer mechanism 40, and is returned from the load-lock module 21 to the desired FOUP 31 via the loader module 30 and accommodated therein. As a result, the wafer processing using the plasma processing system 1 is completed.

<Processing Module 60>

Figure 2:
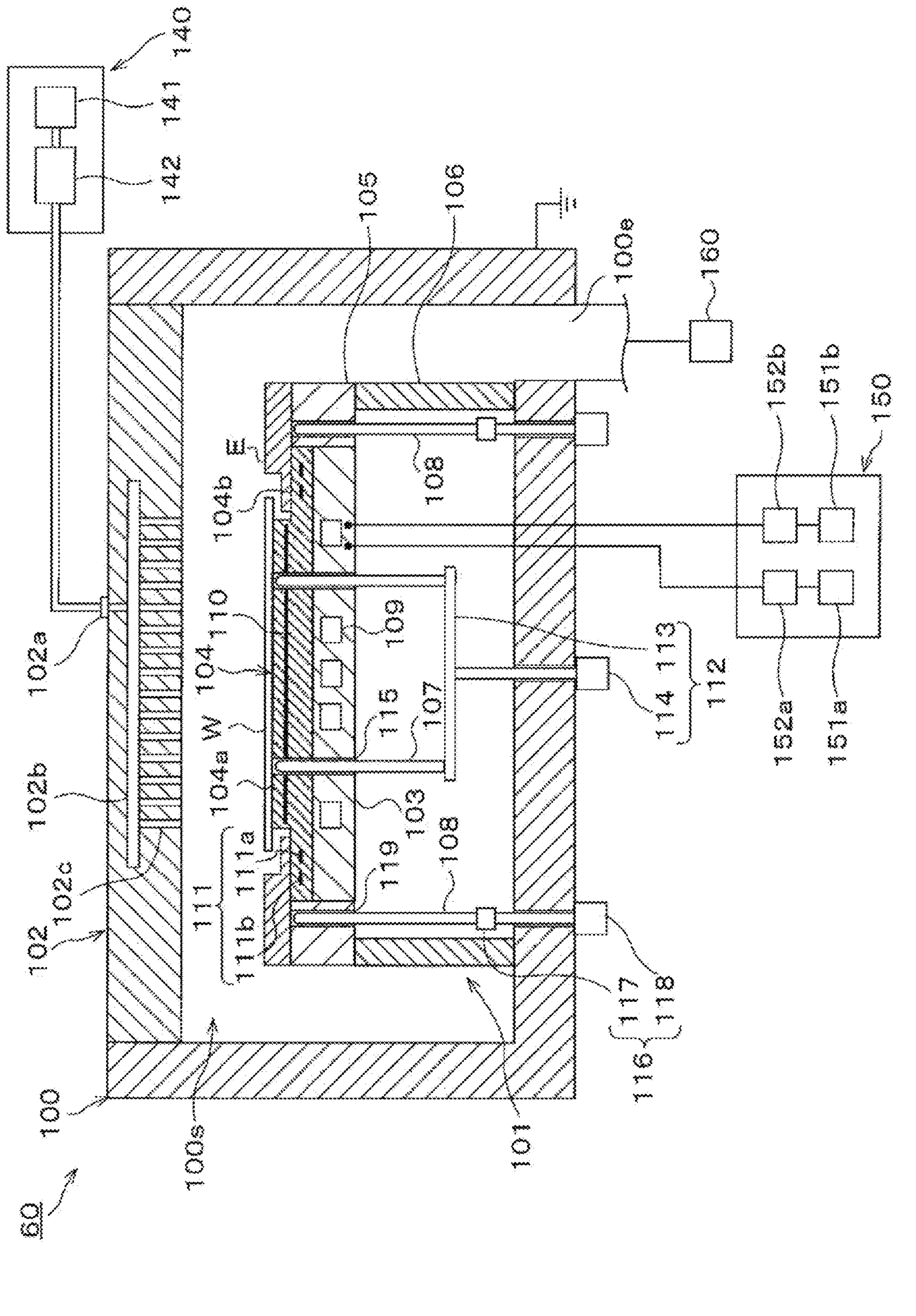
FIG. 2 is a longitudinal cross-sectional view schematically showing a configuration of a processing module.
Figure 3:
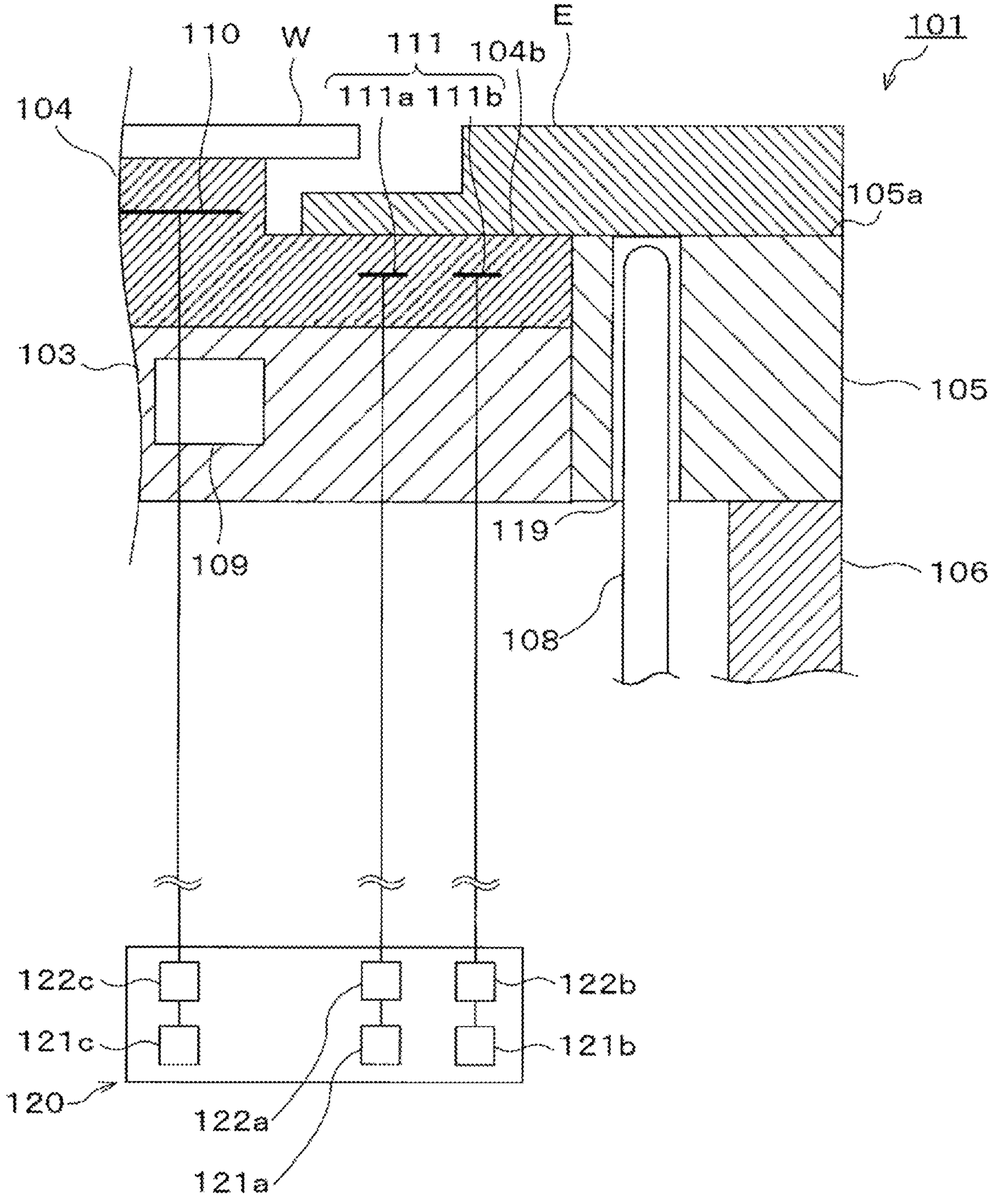
FIG. 3 is a partially enlarged view of FIG. 2.
Figure 4:
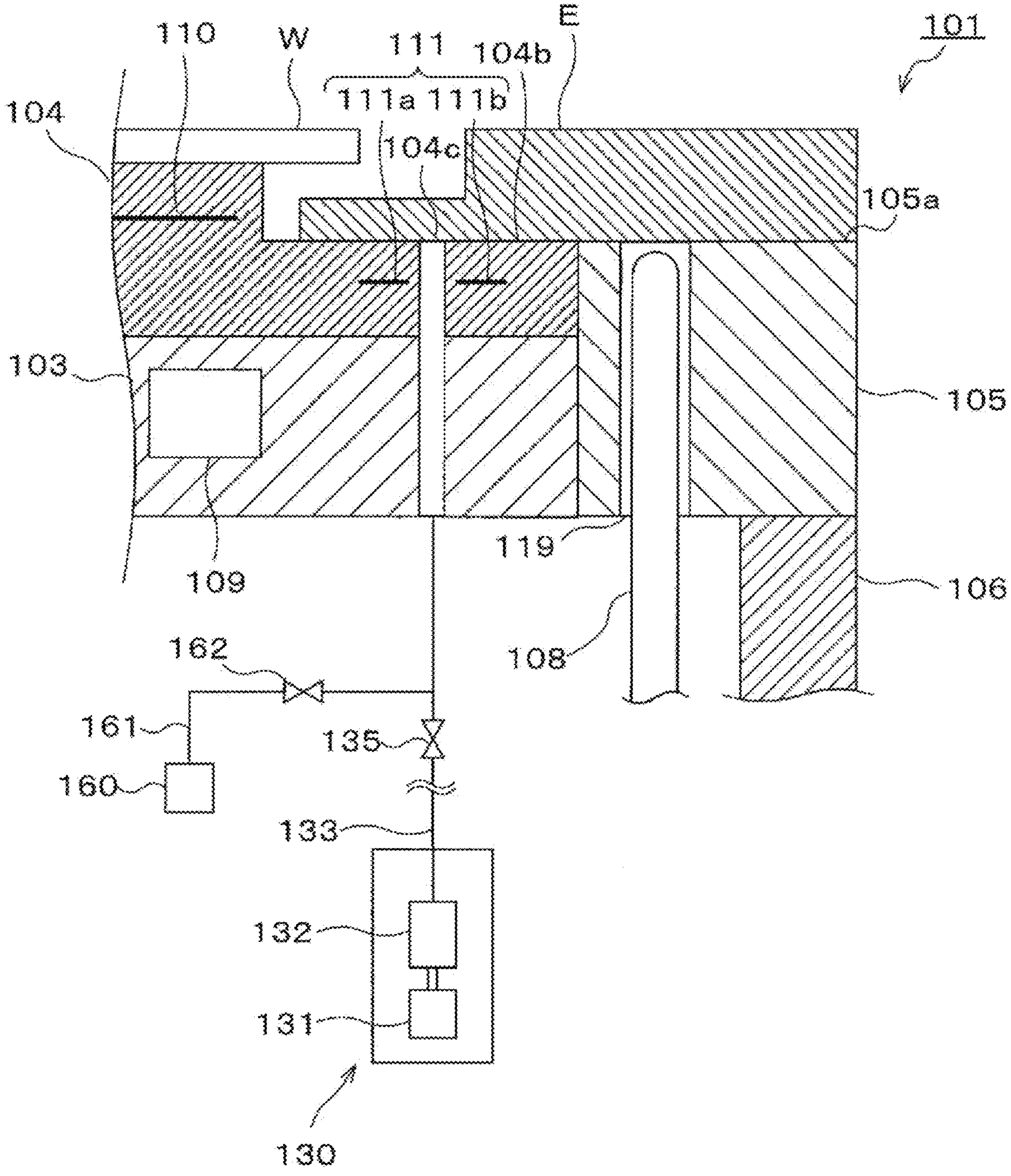
FIG. 4 is an enlarged cross-sectional view of a portion different from a portion shown in FIG. 3 along a circumferential direction of a wafer support table.

Then, the processing module 60 will be described with reference to FIGS. 2 to 4. FIG. 2 is a vertical cross-sectional view schematically showing the configuration of the processing module 60. FIG. 3 is a partially enlarged view of FIG. 2. FIG. 4 is an enlarged cross-sectional view of a part of a wafer support table 101 to be described later, which is different from a part shown in FIG. 3 along the circumferential direction of the wafer support table 101.

As shown in FIG. 2, the processing module 60 includes a chamber 100 as a processing chamber, a gas supply part 140, a radio frequency (RF) power supply part 150, and an exhaust system 160. The processing module 60 further includes a voltage application part 120 (see FIG. 3) and a gas supply part 130 (see FIG. 4). The processing module 60 further includes a wafer support table 101 and an upper electrode 102 serving as a substrate support table.

The chamber 100 is configured to be depressurizable, and defines a processing space 100*s* where plasma is generated. The wafer support table 101 and the like are provided in the chamber 100. The chamber 100 can be made of, e.g., aluminum. The chamber 100 is connected to a ground potential.

The wafer support table 101 is disposed in a lower region in the chamber 100, for example. The upper electrode 102 is located above the wafer support table 101, and can function as a part of the ceiling of the chamber 100.

The wafer support table 101 is configured to support the wafer W. In one embodiment, the wafer support table 101 includes a lower electrode 103, an electrostatic chuck 104, a support 105, an insulator 106, lifters 107, and lifters 108. The wafer support table 101 is also configured to support the edge ring E. The wafer support table 101 may or may not include the edge ring E as a component thereof.

The lower electrode 103 is made of a conductive material, e.g., aluminum. In one embodiment, a channel 109 for a temperature control fluid is formed in the lower electrode 103. The temperature control fluid is supplied to the channel 109 from a chiller unit (not shown) provided outside the chamber 100. The temperature control fluid supplied to the channel 109 is returned to the chiller unit. By circulating the temperature control fluid, e.g., low-temperature brine, as in the channel 109, the wafer support table 101 (specifically, the electrostatic chuck 104), the wafer W, or the edge ring E can be cooled to a predetermined temperature. By circulating the temperature control fluid, e.g., high-temperature brine, in the channel 109, the wafer support table 101 (specifically, the electrostatic chuck 104), the wafer W, or the edge ring E can be heated to a predetermined temperature. The channel 109 can function as at least a part of a cooling part for cooling the edge ring E.

Further, when the wafer support table 101 is provided with a temperature control mechanism, the temperature control mechanism is not limited to the above-described channel 109, and may be, e.g., a resistance heater or the like. In addition, the member provided with the temperature control mechanism in the wafer support table 101 is not limited to the lower electrode 103, and may be another member.

The electrostatic chuck 104 is a member configured to be able to electrostatically attract at least the edge ring E, and is provided on the lower electrode 103. Further, the electrostatic chuck 104 may be configured to be able to electrostatically attract the wafer W. In one embodiment, the central portion of the electrostatic chuck 104 constitutes a substrate placing portion. Further, in one embodiment, the upper surface of the electrostatic chuck 104 is higher at the central portion than at the peripheral portion. In one embodiment, the wafer W is placed on a central upper surface 104*a* of the electrostatic chuck 104, and the edge ring E is placed on a peripheral upper surface 104*b* of the electrostatic chuck 104. In other words, in one embodiment, the central upper surface 104*a* of the electrostatic chuck 104 serves as a wafer placing surface as a substrate placing surface on which the wafer W is placed, and the peripheral upper surface 104*a* of the electrostatic chuck 104 serves as a ring placing surface on which the edge ring E is placed to surround the substrate placing surface.

The edge ring E is a member disposed to surround the wafer W, specifically, a member disposed to surround the wafer W placed on the electrostatic chuck 104. In one embodiment, the edge ring E is disposed to surround the central portion of the electrostatic chuck 104 that is higher than the peripheral portion thereof. The edge ring E is formed in a circular ring shape in plan view. The edge ring E is made of Si, $SiO_2$, or the like.

An electrode 110 for electrostatically attracting the wafer W to the central upper surface 104*a* may be provided at the central portion of the electrostatic chuck 104. In addition, an electrode 111 for electrostatically attracting the edge ring E to the peripheral upper surface 104*a* is provided at the peripheral portion of the electrostatic chuck 104. The electrode 111 is of a bipolar type including a pair of electrodes 111*a* and 111*b* formed at different positions. The electrode 111*a* is provided on the central side, i.e., the inner side, of the electrostatic chuck 104, and the electrode 111*b* is provided on the outer side thereof.

The electrostatic chuck 104 has a configuration in which the electrodes 110 and 111 are embedded in an insulating member made of, e.g., an insulating material.

As shown in FIG. 3, a voltage application part 120 is connected to the electrode 111 such that an electric force (specifically, e.g., Coulomb force) for electrostatically attracting the edge ring E is generated. When the electrode 111 is of a bipolar type, it is configured such that the voltage application part 120 can selectively apply voltages of different polarities or voltages of the same polarity to the pair of electrodes 111*a* and 111*b*.

The voltage application part 120 includes, e.g., two DC power supplies 121*a* and 121*b* and two switches 122*a* and 122*b*.

The DC power supply 121*a* is connected to the electrode 111*a* via the switch 122*a*, and selectively applies a positive voltage or a negative voltage to the electrode 111*a* for electrostatically attracting the edge ring E.

The DC power supply 121*b* is connected to the electrode 111*b* via the switch 122*b*, and selectively applies a positive voltage or a negative voltage to the electrode 111*b* for electrostatically attracting the edge ring E.

The voltage application part 120 may include a DC power supply 121*c* and a switch 122*c*.

The DC power supply 121*c* is connected to the electrode 110 via the switch 122*c*, and applies a voltage to the electrode 110 for electrostatically attracting the wafer W.

Further, in the present embodiment, the central portion of the electrostatic chuck 104 where the electrode 110 is provided and the peripheral portion where the electrode 111 is provided are integrated, but the central portion and the peripheral portion may be separate.

Further, in the present embodiment, the electrode 111 for attracting and holding the edge ring E is of a bipolar type. However, it may be of a monopolar type.

Further, the central portion of the electrostatic chuck 104 is formed to have a diameter smaller than that of the wafer W, for example. When the wafer W is placed on the central upper surface 104*a* of the electrostatic chuck 104, the peripheral portion of the wafer W protrudes from the central portion of the electrostatic chuck 104.

Further, a stepped portion is formed at the upper portion of the edge ring E, and the upper surface of the outer peripheral portion of the edge ring E is formed to be higher than the upper surface of the inner peripheral portion thereof. The inner peripheral portion of the edge ring E is formed to be recessed under the peripheral portion of the wafer W protruding from the central portion of the electrostatic chuck 104. In other words, the inner diameter of the edge ring E is formed to be smaller than the outer diameter of the wafer W.

The support 105 is a member formed in an annular shape in plan view and made of an insulating material such as quartz or the like, and is disposed to surround the lower electrode 103 and the electrostatic chuck 104.

A gas injection hole (not shown) may be formed in the central upper surface 104*a* of the electrostatic chuck 104 to inject a heat transfer gas into the gap between the central upper surface 104*a* and the backside of the wafer W placed thereon. The heat transfer gas is supplied from a gas supply part (not shown) through the gas injection hole. The gas supply part may include one or more gas sources and one or more pressure controllers. In one embodiment, the gas supply part is configured to supply the heat transfer gas from the gas source to the gas supply hole via the pressure controller.

Further, as shown in FIG. 4, a gas injection hole 104*c* is formed in the peripheral upper surface 104*a* of the electrostatic chuck 104. Specifically, one end of the gas injection hole 104*c* is opened in the peripheral upper surface 104*a* of the electrostatic chuck 104. For example, a plurality of gas injection holes 104*c* are provided along the circumferential direction of the electrostatic chuck 104. The gas injection holes 104*c* supply the heat transfer gas such as helium gas to the gap between the rear surface of the edge ring E placed on the peripheral upper surface 104*a* of the electrostatic chuck 104 and the peripheral upper surface 104*b*. Further, the end of the gas injection hole 104*c* opposite to the peripheral upper surface 104*a* is connected to the gas supply part 130 via a line 133. The gas supply part 130 may include one or more gas sources 131 and one or more flow rate controllers 132. In one embodiment, the gas supply part 130 is configured to supply, e.g., a heat transfer gas from the gas sources 131 to the gas injection holes 104*c* via the flow rate controllers 132. The flow rate controllers 132 may include, e.g., a mass flow controller or a pressure-controlled flow rate controller. The gas injection holes 104*c* and the line 133 can function as at least a part of a supply path that supplies a gas to the gap between the peripheral upper surface 104*a* of the electrostatic chuck 104, which is the ring placing surface, and the rear surface of the edge ring E.

Further, the ends of the gas injection holes 104*c* opposite to the peripheral upper surface 104*a* are connected to the exhaust system 160 via a line 161. As a result, the vicinity of the peripheral upper surface 104*a* of the electrostatic chuck 104 can be exhausted via the gas injection holes 104*c*. In other words, the gas injection holes 104*c* can function as exhaust holes for exhausting the vicinity of the ring placing surface including the peripheral upper surface 104*a* of the electrostatic chuck 104. Therefore, in one embodiment, the gas injection holes 104*c* and the line 161 can function as at least a part of an exhaust path for exhausting the space between the peripheral upper surface 104*a* of the electrostatic chuck 104, which is the ring placing surface, and the rear surface of the edge ring E.

Further, the line 133 may be provided with a switching valve 135 for switching start/stop of the supply of heat transfer gas by the gas supply part 130. Similarly, the line 161 may be provided with a switching valve 162 for switching start/stop of the exhaust of the vicinity of the peripheral upper surface 104*a* by the exhaust system 160.

The insulator 106 shown in FIG. 2 is a cylindrical member made of ceramic or the like, and supports the support 105. The insulator 106 is formed to have an outer diameter equal to the outer diameter of the support 105, for example, and supports the peripheral portion of the support 105.

The lifters 107 are members that are raised and lowered with respect to the central upper surface 104*a* of the electrostatic chuck 104, and are formed in a columnar shape and made of ceramic, for example. When the lifters 107 are raised, the upper ends thereof protrude from the central upper surface 104*a*, and can support the wafer W. Due to the lifters 107, the wafer W can be transferred between the wafer support table 101 and the transfer arm 71 of the transfer robot 70.

Further, three lifters 107 are provided to be spaced apart from each other, and extend in the vertical direction.

The lifters 107 are raised and lowered by an actuator 112. The actuator 112 has, e.g., a support member 113 for supporting the lifters 107, and a driving part 114 for generating a driving force for raising and lowering the support member 113 and raising and lowering the lifters 107. The driving part 114 has, e.g., a motor (not shown) as a driving source for generating the driving force.

The lifters 107 are inserted into insertion holes 115 whose upper ends are opened on the central upper surface 104*a* of the electrostatic chuck 104. The insertion holes 115 are formed to extend downward from the central upper surface 104*a* of the electrostatic chuck 104 to the bottom surface of the lower electrode 103.

The lifters 108 are lifting members that are raised and lowered with respect to the peripheral upper surface 104*a* of the electrostatic chuck 104, and are made of, e.g., a ceramic material. The lifters 108 are formed in a columnar shape, for example, except the upper ends (i.e., the tip end) thereof. The upper ends of the lifters 108 are formed in a hemispherical shape. In one embodiment, the lifters 108 are configured such that the upper ends thereof can protrude from the upper surface 105*a* of the support 105 when the lifters 108 are raised.

Further, three lifters 108 are provided to be spaced apart from each other at intervals along the circumferential direction of the electrostatic chuck 104, and extend in the vertical direction.

The lifters 108 are raised and lowered by an actuator 116. The actuator 116 has a support member 117 that is provided for each lifter 108, for example, and supports the lifter 108 to be movable in the horizontal direction. The support member 117 has, e.g., a thrust bearing, to support the lifters 108 to be movable in the horizontal direction. Further, the actuator 116 has a driving part 118 for raising and lowering the lifters 108 by generating a driving force for raising and lowering the support member 117. The driving par 118 has, e.g., a motor (not shown) as a driving source for generating the driving force.

In one embodiment, the lifters 108 are inserted into insertion holes 119 whose upper ends are opened on the upper surface 105*a* of the support 105. The insertion holes 119 are formed to penetrate through the support 105 in the vertical direction, for example.

By using the lifters 108 described above, the edge ring E can be transferred between the wafer support table 101 and the transfer arm 71 of the transfer robot 70.

The lifters 108 and the actuator 116 constitute a lifting mechanism for raising and lowering the edge ring E relative to the ring placing surface.

The upper electrode 102 also functions as a gas supply part, i.e., a shower head, that supplies one or more gases from the gas supply part 140 into the chamber 100. In one embodiment, the upper electrode 102 has a gas inlet 102*a*, a gas diffusion space 102*b*, and a plurality of gas outlets 102*c*. The gas inlet 102*a* is in fluid-communication with, e.g., the gas supply part 140 and the gas diffusion space 102*b*. The plurality of gas outlets 102*c* are in fluid-communication with the gas diffusion spacer 102*b* and the chamber 100. In one embodiment, the upper electrode 102 is configured to supply gases, such as one or more processing gases, from the gas inlet 102*a* into the chamber 100 via the gas diffusion space 102*b* and the plurality of gas outlets 102*c*. The upper electrode 102 may function as at least a part of a cooling part for cooling the edge ring E.

The gas supply part 140 may include one or more gas sources 141 and one or more flow rate controllers 142. In one embodiment, the gas supply part 140 is configured to supply, e.g., one or more gases from the corresponding gas sources 141 to the gas inlet 102*a* via the corresponding flow rate controllers 142. The flow rate controllers 142 may include, e.g., a mass flow controller or a pressure-controlled flow rate controller. Further, the gas supply 140 may include one or more flow modulation devices for modulating the flow rate of one or more gases or causing it to pulsate.

The RF power supply 150 is configured to supply an RF power, e.g., one or more RF signals, to one or more electrodes, such as the lower electrode 103, the upper electrode 102, or both the lower electrode 103 and the upper electrode 102. As a result, plasma is generated from one or more processing gases supplied to the chamber 100, i.e., the processing space 100*s*. Therefore, the RF power supply 150 can function as at least a part of a plasma generating part for generating plasma in the chamber 100. Specifically, the plasma generating part is configured to generate plasma from one or more gases in the chamber 100. The RF power supply 150 includes, e.g., two RF generators 151*a* and 151*b* and two matching circuits 152*a* and 152*b*. In one embodiment, the RF power supply 150 is configured to supply a first RF signal from the first RF generator 151*a* to the lower electrode 103 via the first matching circuit 152*a*. For example, the first RF signal may have a frequency within a range of 27 MHz to 100 MHz.

Further, in one embodiment, the RF power supply 150 is configured to supply a second RF signal from the second RF generator 151*b* to the lower electrode 103 via the second matching circuit 152*b*. For example, the second RF signal may have a frequency within a range of 400 kHz to 13.56 MHz. Alternatively, a direct current (DC) pulse generator may be used instead of the second RF generator 151*b*.

Further, although not shown, other embodiments may be considered in the present disclosure. For example, in an alternative embodiment, the RF power supply 150 may be configured to supply a first RF signal from an RF generator to the lower electrode 103, a second RF signal from another RF generator to the lower electrode 103, and a third RF signal from still another RF generator to the lower electrode 103. In addition, in another alternative embodiment, a DC voltage may be applied to the upper electrode 102.

Further, in various embodiments, amplitudes of one or more RF signals (i.e., the first RF signal, the second RF signal, and the like) may pulsate or be modulated. The amplitude modulation may include causing the RF signal amplitude to pulsate between an ON state and an OFF state, or between two or more different ON states.

The exhaust system 160 may be connected to, e.g., an exhaust port 100*e* provided at the bottom portion of the chamber 100. The exhaust system 160 may include a pressure valve and a vacuum pump. The vacuum pump may include a turbo molecular pump, a roughing pump, or a combination thereof.

Example 1 of Processing Sequence

Figure 5:
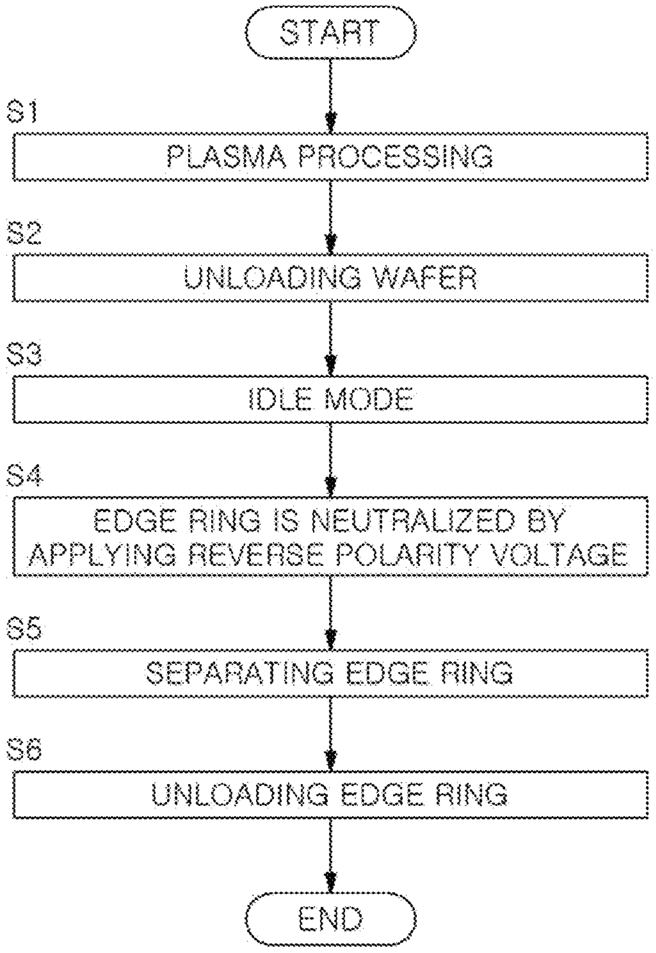
FIG. 5 is a flowchart showing Example 1 of a processing sequence including an edge ring separation sequence.

Next, an example of a processing sequence including a sequence for separating the edge ring E from the processing module 60, which is performed by the plasma processing system 1, will be described. FIG. 5 is a flowchart showing Example 1 of the processing sequence. FIGS. 6 to 8 and 10 are explanatory diagrams of the state of the processing module 60 and the state of voltage application to the electrode 111 in the case of executing the steps included in Example 1 of the processing sequence. In FIGS. 6 to 8 and 10, valves in an open state are expressed in white, valves in a closed state are expressed in black, and lines through which a gas flows are expressed by thick lines. Further, FIGS. 6 to 8 and 10, the gas injection holes 104*c* for exhausting a gas are expressed in black, the gas injection holes 104*c* in which a heat transfer gas exists are expressed in gray, and the gas injection holes 104*c* in the other states are expressed in white. FIG. 9 is a diagram for explaining the neutralization mechanism of the edge ring E. Further, each of the following steps is executed by the plasma processing system 1 under the control of the controller 80 (specifically, the processing part 91) based on the program stored in the storage part 92.

First, as shown in FIG. 5, in a state where a voltage is applied to the electrode 111 of the electrostatic chuck 104 and the edge ring E is electrostatically attracted to the ring placing surface, plasma processing is performed on the wafer W placed on the wafer placing surface (step S1).

Specifically, for example, first, the wafer W held by the transfer arm 71 of the transfer robot 70 is loaded into the chamber 100, and the wafer W is placed on the central upper surface (i.e., the wafer placing surface) 104*a* of the electrostatic chuck 104 by raising and lowering the lifters 107 and removing the transfer arm 71 from the chamber 100. Then, a DC voltage is applied from the DC power source 121*c* to the electrode 110 of the electrostatic chuck 104, so that the wafer W is electrostatically attracted and held on the electrostatic chuck 104. Further, after the wafer W is loaded, the inside of the chamber 100 is depressurized to a predetermined vacuum level by the exhaust system 160.

Next, a processing gas is supplied from the gas supply part 140 to the processing space 100*s* via the upper electrode 102. Further, a high frequency power HF for plasma generation is supplied from the RF power supply part 150 to the lower electrode 103, so that the processing gas is excited to generate plasma. In this case, a high frequency power LF for ion attraction may be supplied from the RF power supply part 150. Then, plasma processing such as etching or the like is performed on the wafer W by the action of the generated plasma.

Further, during the plasma processing, a heat transfer gas is injected toward the bottom surface of the wafer W attracted and held by the electrostatic chuck 104.

Figure 6:
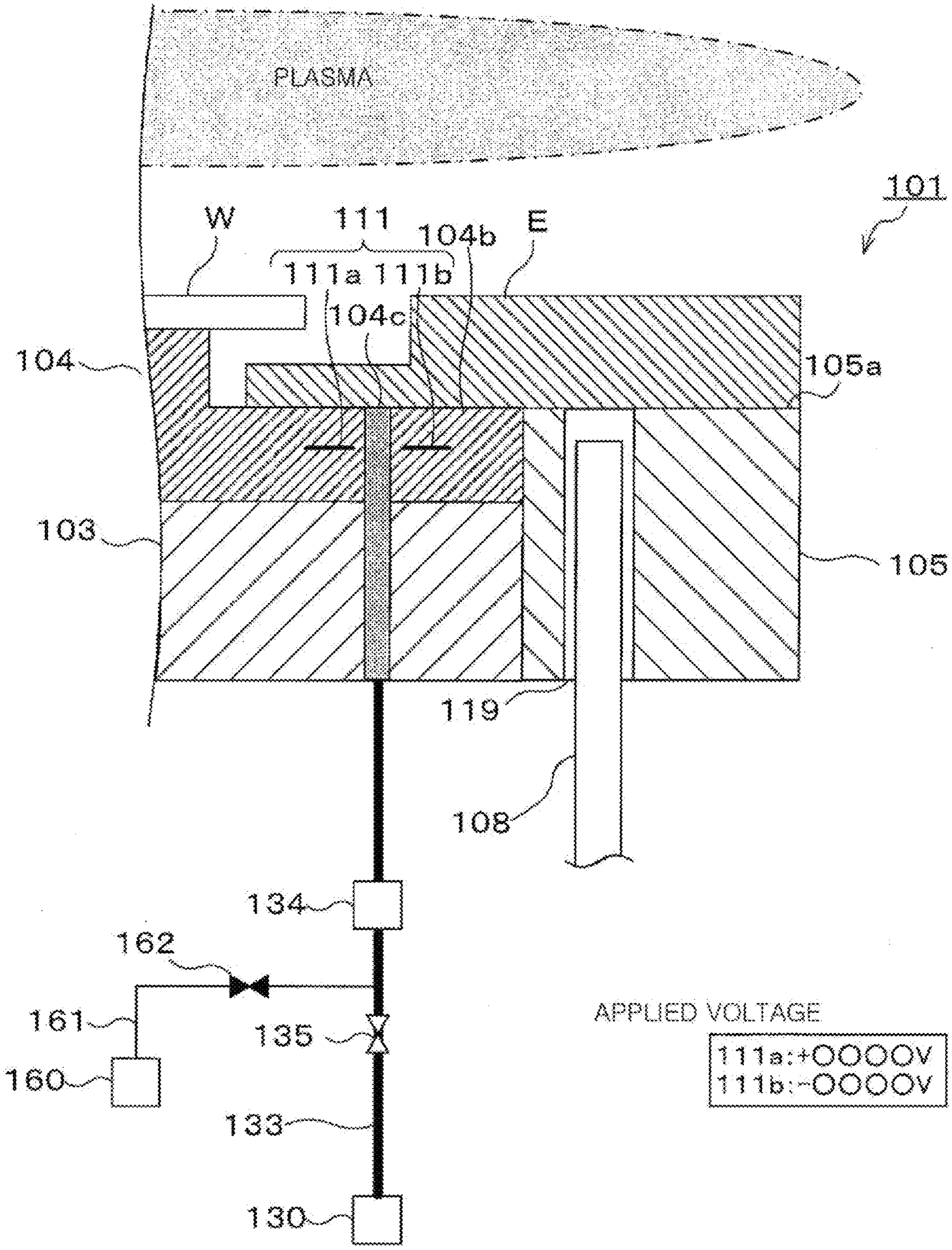
FIG. 6 is an explanatory diagram of a state of voltage application to an electrode for the edge ring, and a state of a processing module in the case of performing a process included in Example 1 of the processing sequence.

Furthermore, during the plasma processing, a DC voltage is applied from the DC power sources 121*a* and 121*b* to the electrode 111 of the electrostatic chuck 104. As a result, the edge ring E is electrostatically attracted and held on the ring placing surface including the peripheral upper surface 104*a* of the electrostatic chuck 104. In this case, as shown in FIG. 6, for example, the voltages applied to the electrodes 111*a* and 111*b* have different polarities.

Further, during the plasma processing, the heat transfer gas supplied from the gas supply part 130 is injected through the gas injection holes 104*c* into the gap between the ring placing surface and the edge ring E.

In order to complete the plasma processing, the supply of the high frequency power HF from the RF power supply part 150 and the supply of the processing gas from the gas supply part 140 are stopped. If the high frequency power LF is supplied during the plasma processing, the supply of the high frequency power LF is also stopped. Next, the electrostatic attraction of the wafer W by the electrostatic chuck 104 is stopped. In addition, the supply of the heat transfer gas to the bottom surface of the wafer W is also stopped.

Then, the wafer W is transferred from the chamber 100 to the transfer module 50 (step S2).

Specifically, for example, the wafer W is raised by the lifters 107 and separated from the central upper surface (i.e., the wafer placing surface) 104*a* of the electrostatic chuck 104. Next, the gate valve 62 is opened, and the transfer arm 71 of the transfer robot 70 is inserted into the chamber 100. Then, the lifters 107 are lowered, and the wafer W is transferred from the lifters 108 to the transfer arm 71. Next, the transfer arm 71 is removed from the chamber 100, and the wafer W is transferred from the chamber 100 to the transfer module 50. Thereafter, the gate valve 62 is closed.

Further, after the plasma processing in step S1, a voltage of a first polarity is applied to the electrode 111 of the electrostatic chuck 104. Specifically, after the plasma processing in step S1, the processing module 60 is shifted to an idle mode (step S3) immediately before the edge ring E is neutralized in step S4 to be described later. In the idle mode, which is a mode after the plasma processing of the wafer W, the edge ring E is attracted to the electrostatic chuck 104 by applying a voltage of a first polarity to the electrode 111 of the electrostatic chuck 104. Further, the idle mode is a mode in which plasma processing is not performed, and the first polarity is different from that in the step of performing the plasma processing in step S1, for example.

Figure 7:
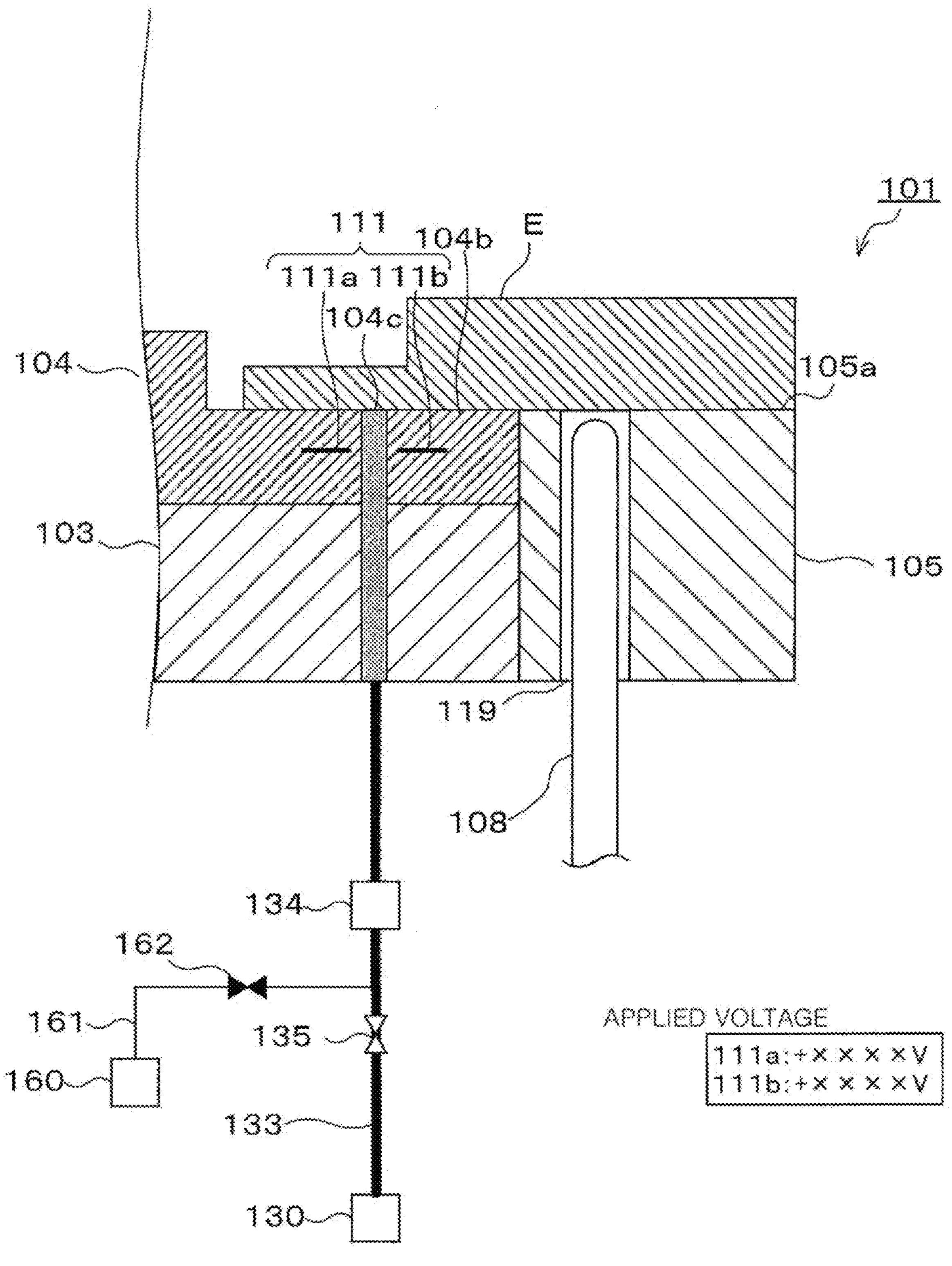
FIG. 7 is an explanatory diagram of a state of voltage application to the electrode for the edge ring, and a state of the processing module in the case of performing a process included in Example 1 of the processing sequence.

More specifically, in step S3, the polarity of the voltage applied to the electrode 111 of the electrostatic chuck 104 is changed. For example, as shown in FIG. 7, the polarity of the voltage applied to any one of the electrode 111*a* and the electrode 111*b* is changed from the start of the plasma processing, so that the polarities of the voltages applied to the electrodes 111*a* and 111*b* become the same. Further, the magnitude of the voltage applied to the electrode 111 may be changed from the start of the plasma processing.

Further, in step S3, i.e., in the idle mode, the injection of the heat transfer gas through the gas injection holes 104*c* continues.

Either step S2 or step S3 may be performed first. For example, the wafer W of step S2 may be unloaded during step S3, i.e., during the idle mode. Step S3 may be performed after the wafer W of step S2 is unloaded. In other words, the processing module 60 may be shifted to the idle mode.

Next, if the plasma processing is performed on another wafer W, the sequence returns to step S2, but the edge ring E may be removed. In this case, the edge ring E is neutralized first (step S4).

Specifically, in a state where a gas is supplied from the upper electrode 102 into the chamber 100, a voltage of a second polarity different from the first polarity applied to the electrode 111 in step S3 is applied to the electrode 111. After a predetermined period of time elapses, the application of the voltage to the electrode 111 is stopped.

More specifically, for example, first, a predetermined gas (e.g., nitrogen gas) is supplied at a predetermined flow rate from the gas supply part 140 to the processing space 100*s* via the upper electrode 102 and, at the same time, the exhaust system 160 starts to control an exhaust operation such that a pressure in the chamber 100 becomes a target pressure. For example, the predetermined flow rate is 100 sccm to 1000 sccm, and the target pressure is 100 m Torr to 1000 m Torr.

Figure 8:
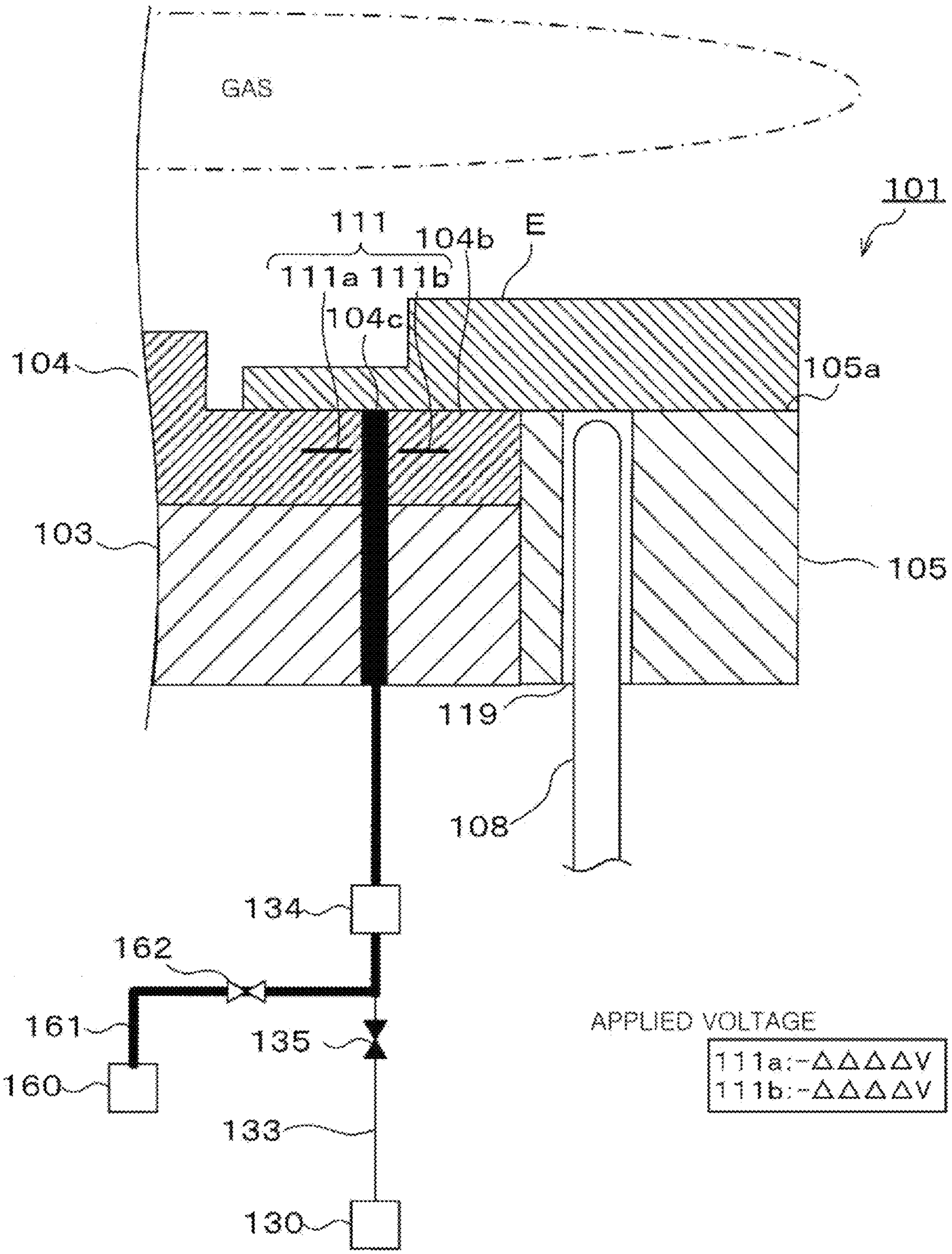
FIG. 8 is an explanatory diagram of a state of voltage application to the electrode for the edge ring, and a state of the processing module in the case of performing a process included in Example 1 of the processing sequence.

Then, after a predetermined standby time T1 elapses and the chamber 100 is maintained in an atmosphere of a predetermined gas, as shown in FIG. 8, a voltage of a polarity opposite to that in the idle mode in step S3 is applied to the electrode 111. Specifically, the application of the voltages of the same polarity different from that in step S3 to the electrodes 111*a* and 111*b* is started. Further, the magnitude of the voltage applied to the electrode 111 may be changed from the idle mode in step S3, and may be, e.g., 1000V to 5000V. For example, the absolute value of the voltage of the polarity opposite to that in the idle mode applied in step S4 may be less than or equal to the absolute value of the voltage applied in the idle mode. The standby time T1 is, e.g., 15 seconds or more.

When a predetermined period of time T2 elapses from the start of the application, the application to the electrode 111 is stopped. The predetermined period of time T2 is, e.g., 0.5 seconds to 600 seconds, preferably 1 second to 60 seconds, and more preferably 2 seconds to 40 seconds.

The application of the reverse polarity voltage causes an event that is electrically equivalent to the charges of the edge ring E before the application flowing through the gas in the chamber 100 to the ground potential to which the chamber 100 is connected, and also promotes the occurrence of the event, thereby neutralizing the edge ring E.

Figure 9A:
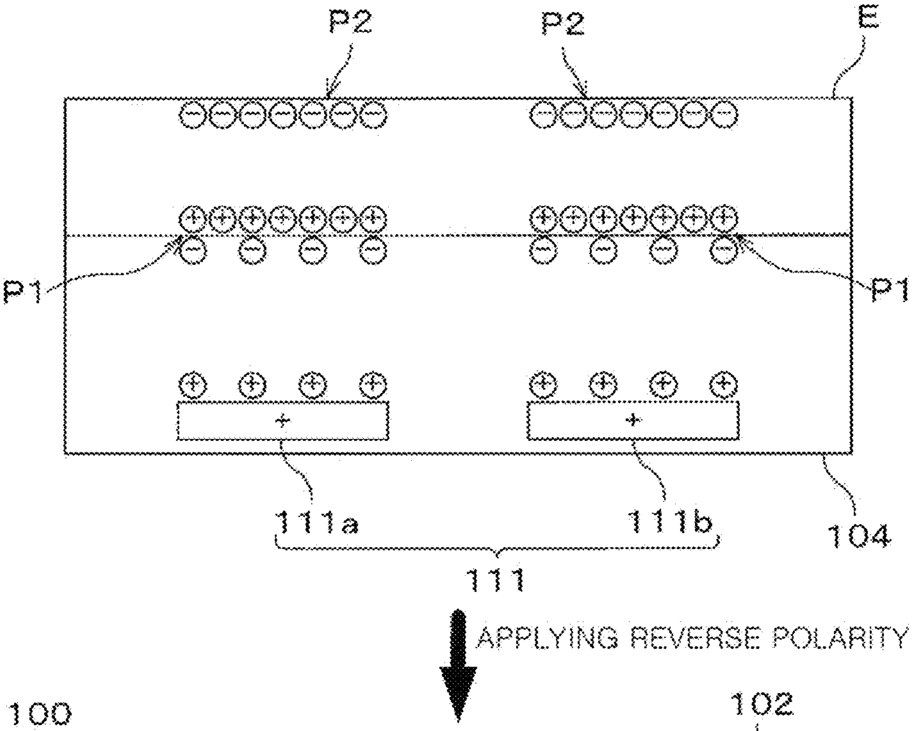
FIGS. 9A and 9B are diagrams for explaining the neutralization mechanism of the edge ring.
Figure 9B:
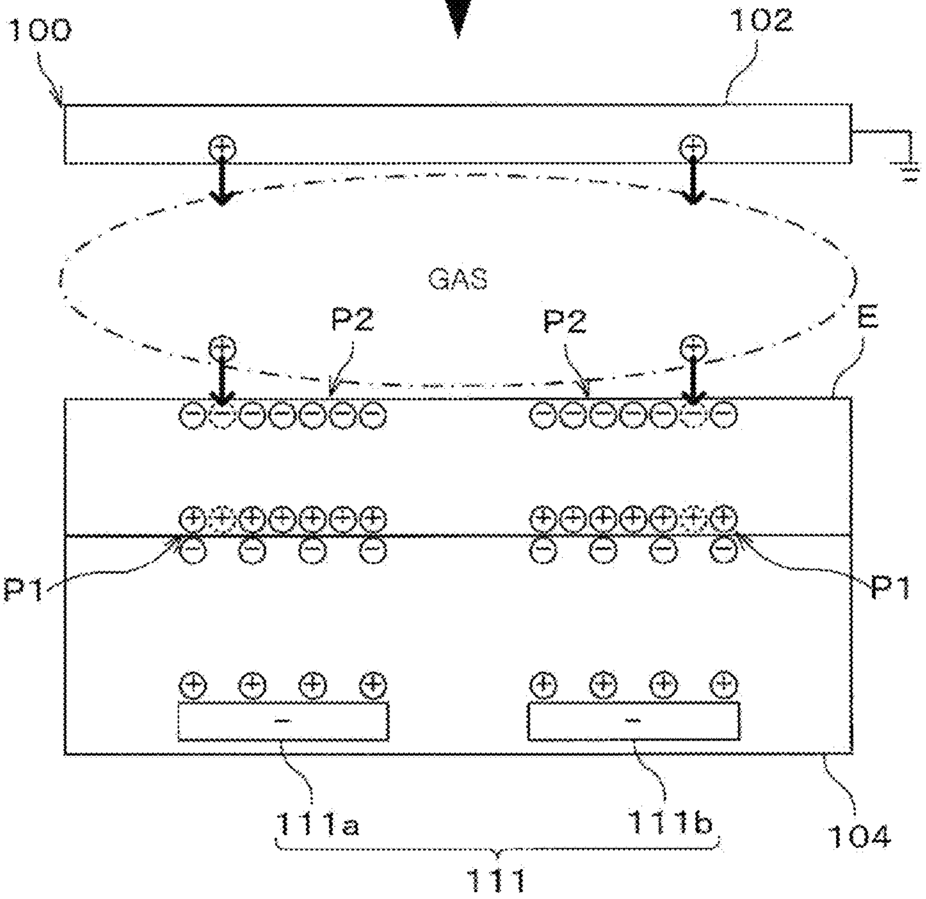

Further, the specific mechanism of the neuralization of the edge ring E by applying the reverse polarity voltage may be considered as follows. In other words, when the reverse polarity voltage is applied to the electrode 111, as shown in FIGS. 9A and 9B, a portion P1 of the edge ring E on the electrostatic chuck 104 side has approximately the same charge amount and the opposite polarity as that before the application, whereas a portion P2 on the opposite side to the portion P1 has approximately the same charge amount and the same polarity as that before the application. If the reverse polarity voltage application is continued, charges of the polarity opposite to that of the portion P2 are incident on the portion P2 of the edge ring E, and the charge amount of the portion P2 decreases. As a result, the charge amount of the portion P1 decreases. In other words, the edge ring E is considered to be neutralized.

In addition, in step S4, as shown in FIG. 8, the switching valve 135 is closed, and the injection of the heat transfer gas through the gas injection holes 104*c* to the gap between the ring placing surface and the edge ring E is stopped. At the same time, the switching valve 162 is opened. As a result, the exhaust system 160 starts exhausting the supply path including the gas injection holes 104*c*, i.e., exhausting the gap.

Then, when the application of the reverse polarity voltage is stopped, the exhaust through the gas injection holes 104*c* is also stopped, and the supply of a predetermined gas to the processing space 100*s* through the upper electrode 102 is also stopped.

Then, the edge ring E is raised by the lifting mechanism including the lifters 108, and separated from the ring placing surface (step S5).

Figure 10:
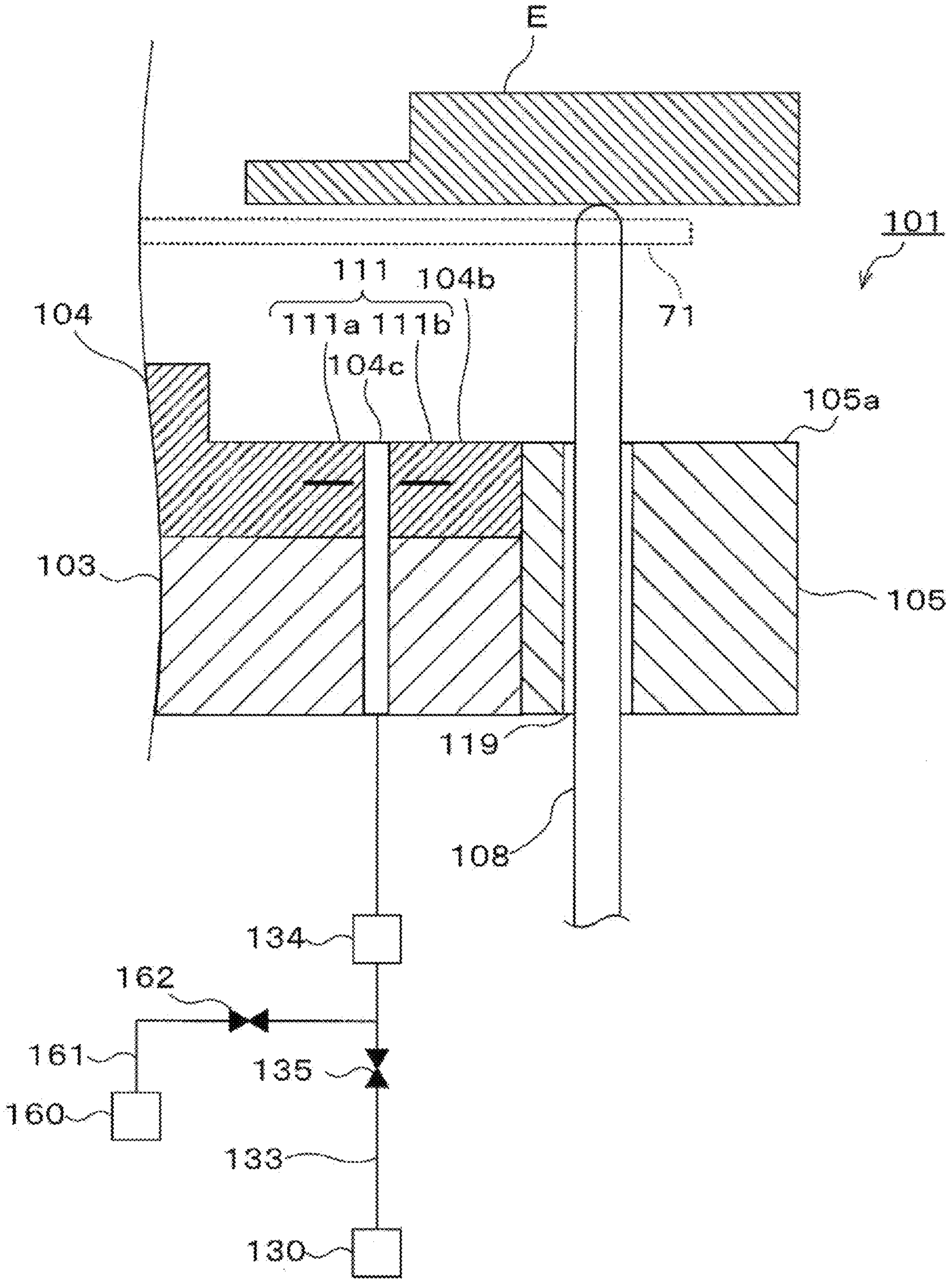
FIG. 10 is an explanatory diagram of a state of voltage application to the electrode for the edge ring, and a state of the processing module in the case of performing a process included in Example 1 of the processing sequence.

Specifically, as shown in FIG. 10, for example, all the lifters 108 are raised. First, the edge ring E is transferred from the ring placing surface including the peripheral upper surface 104*a* of the electrostatic chuck 104 to the lifters 108 that have passed through the insertion holes 119. Thereafter, all the lifters 108 continue to be raised until they reach a predetermined height, and the edge ring E is separated from the ring placing surface.

Then, the edge ring E is transferred from the chamber 100 to the transfer module 50 by the transfer robot 70 (step S6).

Specifically, for example, the gate valve 62 is opened, and the transfer arm 71 of the transfer robot 70 is inserted into the chamber 100. Next, the transfer arm 71 is moved between the edge ring E supported by the lifters 108 and the electrostatic chuck 104. Then, all the lifters 108 are lowered, and the edge ring E is transferred to the transfer arm 71. Next, the transfer arm 71 is removed from the chamber 100, and the edge ring E is transferred from the chamber 100 to the transfer module 50. Thereafter, the gate valve 62 is closed.

In this manner, the processing sequence including the sequence for separating the edge ring E is completed.

<Main Effects of Example 1 of Processing Sequence>

In Example 1 of the processing sequence, in the process of neutralizing the edge ring E in step S4, the voltage of the second polarity different from the first polarity applied to the electrode 111 in the idle mode in step S2 is applied to the electrode 111 while a gas is supplied from the upper electrode 102 into the chamber 100. Then, after a predetermined period of time elapses, the application of the voltage to the electrode 111 is stopped. Therefore, the edge ring E can be efficiently neutralized. In addition, since the electrostatic attraction force of the edge ring E to the electrostatic chuck 104 is weakened by the neutralization of the edge ring E, the edge ring E is raised by the lifting mechanism including the lifters 108 after the neutralization of the edge ring as in Example 1 of the processing sequence to suppress damage to the lifters 108 and the edge ring E during the lifting operation.

In addition, in Example 1 of the processing sequence, in the process of neutralizing the edge ring E in step S4, a reverse polarity voltage is applied to the electrode 111 while the supply path including the gas exhaust holes 104*c* serving as exhaust holes, is being exhausted, i.e., the gap between the edge ring E and the ring placing surface is being exhausted, without injecting the heat transfer gas through the gas injection holes 104*c*. On the contrary, if a reverse polarity voltage is applied to the electrode 111 while the heat transfer gas is injected through the gas injection holes 104*c*, when the electrostatic attraction force of the edge ring E has weakened, the edge ring E may be considerably deviated from the electrostatic chuck 104, and the position of the edge ring E on the electrostatic chuck may be shifted, which may make it impossible to receive the edge ring E through the lifters 108. As described above, by applying a reverse polarity voltage to the electrode 111 while performing the exhaust operation without injecting the heat transfer gas, it is possible to prevent the edge ring E from deviating considerably from the electrostatic chuck 104.

Further, in Example 1 of the processing sequence, voltages of different polarities are applied to the electrodes 111*a* and 111*b* during the plasma processing in step S1. According to the inventors' repeated tests, by applying voltages of different polarities to the electrodes 111*a* and 111*b*, the electrostatic attraction force of the edge ring E can become stronger compared to the case of applying voltages of the same polarity. Therefore, according to Example 1 of the processing sequence, the electrostatic attraction force of the edge ring E can become stronger during the plasma processing. As a result, the temperature of the edge ring E can be efficiently adjusted via the electrostatic chuck 104 during the plasma processing.

Further, in Example 1 of the processing sequence, in the process of switching to the idle mode in step S3, voltages of the same polarity are applied to the electrodes 111*a* and 111*b*, unlike the plasma processing in step S1. In contrast, if voltages of the same polarity as that in the plasma processing in step S1 are applied to the electrodes 111*a* and 111*b* even during the idle mode, the charges of the portion of the edge ring E on the electrostatic chuck 104 side move toward the electrostatic chuck, which may cause the charge amount of the edge ring E on the electrostatic chuck side to decrease, and the attraction force of the edge ring E by the electrostatic chuck 104 to be weakened. In contrast, as described above, by applying voltages of the same polarity to the electrodes 111*a* and 111*b* during the idle mode, unlike the plasma processing in step S1, it is possible to suppress the movement of charges from the portion of the edge ring E on the electrostatic chuck 104 side toward the electrostatic chuck 104. Therefore, when the plasma processing is performed continuously, it is possible to prevent the attraction force of the edge ring E by the electrostatic chuck 104 from being gradually weakened.

Further, according to Example 1 of the processing sequence, unlike Example 2, the following effects are obtained compared to the case of applying voltages of the same polarity to the electrodes 111*a* and 111*b* during the plasma processing in step S1 and applying voltages of different polarities to the electrodes 111*a* and 111*b* during the idle mode in step S3. In other words, the charge amount of the edge ring E in the idle mode in step S3 may be reduced to weaken the electrostatic attraction force of the edge ring E. Therefore, even if the neutralization amount in the process of neutralizing the edge ring E in step S4, which is performed subsequent to the idle mode of step S3, is small, the edge ring E can be easily separated from the electrostatic chuck 104.

Further, the present inventors have conducted a test on the influence of the magnitude of the voltage applied to the electrode 111 during the neutralization of the edge ring E in step S4 on the electrostatic attraction force of the edge ring E by the electrostatic chuck 104 after the application of the voltage is stopped. According to the results of the test, if the magnitude of the voltage applied to the electrode 111 during the neutralization is within a predetermined range that is neither too small nor too large, the electrostatic attraction force can be sufficiently weakened. Since, however, the predetermined range of the magnitude of the voltage varies depending on other neutralization conditions, it is preferable to optimize it for each processing module 60.

Further, the present inventors have conducted a test on the influence of the period of time in which a voltage is applied to the electrode 111 during the neutralization of the edge ring E in step S4 on the electrostatic attraction force of the edge ring E by the electrostatic chuck 104 after the application of the voltage is stopped. According to the results of the test, if the predetermined period of time T2 in which a voltage is applied to the electrode 111 during the neutralization is within a predetermined range that is neither too short nor too long, the electrostatic attraction force can be sufficiently weakened. Since, however, the predetermined range of the voltage application time varies depending on other neutralization conditions, it is preferable to optimize it for each processing module 60.

Moreover, the present inventors have conducted a test on the influence of a flow rate of a gas introduced into the chamber 100 via the upper electrode 102 and a target pressure in the chamber 100 at the time of gas introduction on the electrostatic attraction force of the edge ring E by the electrostatic chuck 104 during the neutralization of the edge ring E in step S4. According to the results of the test, if the flow rate of the gas and the target pressure in the chamber 100 are greater than or equal to a predetermined threshold, the electrostatic attraction force can be sufficiently weakened. Since, however, the predetermined threshold varies depending on other neutralization conditions, it is preferable to optimize it for each processing module 60.

Further, the present inventors have conducted a test on the influence of the standby time T1 from the start of introduction of a gas into the chamber 100 via the upper electrode 102 and the start of exhaust control for setting a pressure in the chamber 100 to the target pressure on the electrostatic attraction force of the edge ring E by the electrostatic chuck 104 during the neutralization of the edge ring E in step S4.

According to the results of the test, if the standby time T1 is greater than or equal to the predetermined threshold, the electrostatic attraction force can be sufficiently weakened. Since, however, the predetermined threshold value for the standby time T1 varies depending on other neutralization conditions, it is preferable to optimize it for each processing module 60.

Furthermore, the present inventors have conducted a test on the influence of the magnitude of the voltage applied to the electrode 111 of the electrostatic chuck 104 in the idle mode in step S3 on the electrostatic attraction force of the edge ring E by the electrostatic chuck 104 after the neutralization in step S4. According to the test, if the magnitude of the voltage applied to the electrode 111 in the idle mode is within a predetermined range that is neither too small nor too large, the electrostatic attraction force can be sufficiently weakened. Further, according to the test, the magnitude of the voltage applied to the electrode 111 in the idle mode affects the appropriate range of the voltage applied to the electrode 111 during the neutralization of the edge ring E in step S4. Based on the above results, it is preferable to optimize the magnitude of the voltage applied to the electrode 111 during the neutralization of the edge ring E in step S4 in response to the magnitude of the voltage applied to the electrode 111 of the electrostatic chuck 104 in the idle mode.

Example 2 of Processing Sequence

Figure 11:
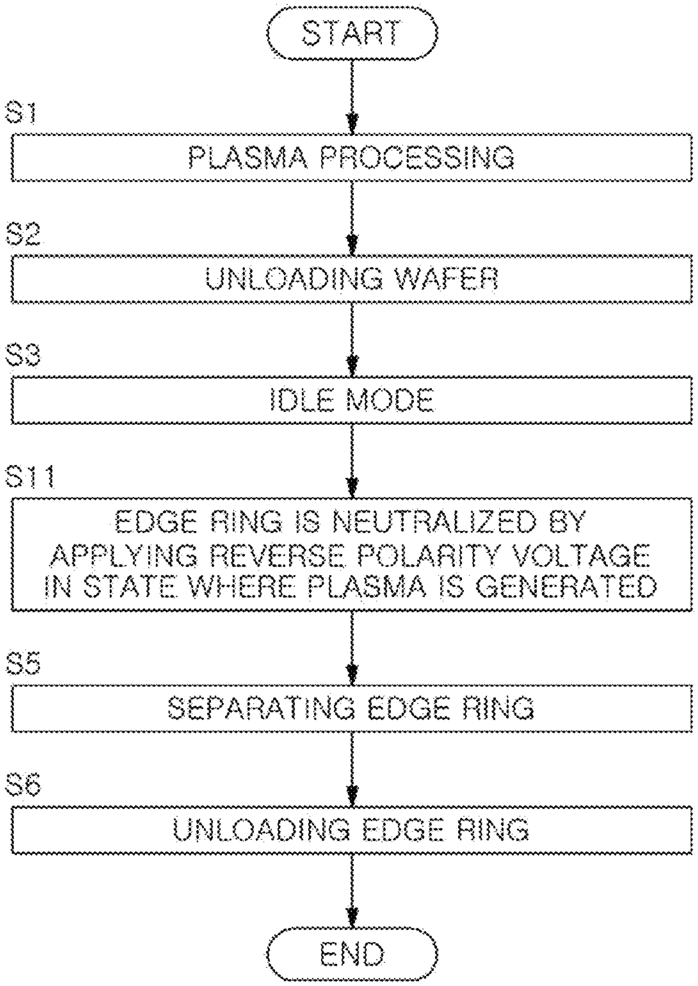
FIG. 11 is a flowchart showing Example 2 of the processing sequence including the edge ring separation sequence.
Figure 12:
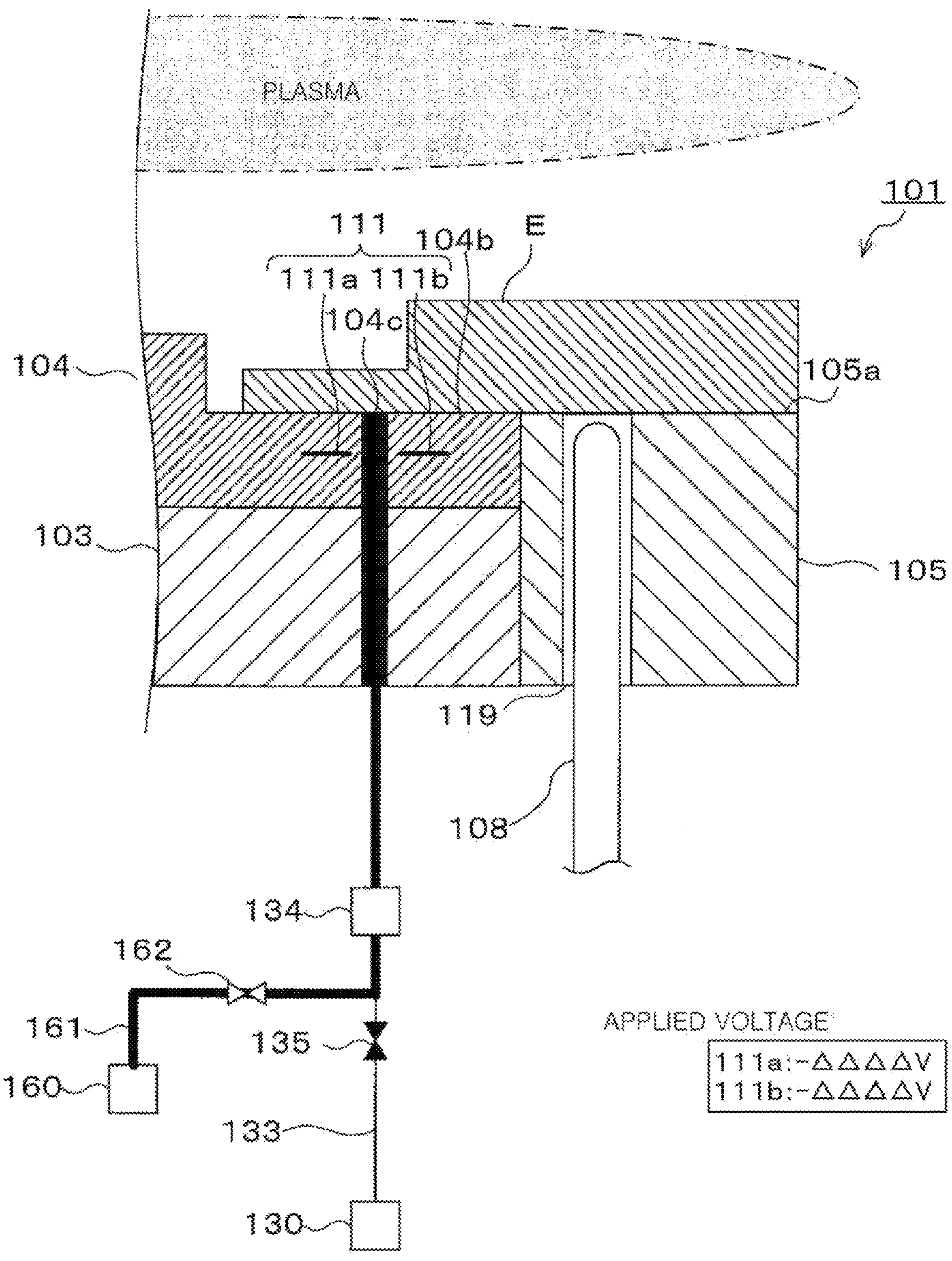
FIG. 12 is an explanatory diagram showing a state of voltage application to the electrode for the edge ring, and a state of the processing module in the case of performing an edge ring neutralization process included in Example 2 of the processing sequence.

FIG. 11 is a flowchart showing Example 2 of the processing sequence including the sequence of separating the edge ring E from the processing module 60. FIG. 12 is an explanatory diagram of the state of the processing module 60 and the state of voltage application to the electrode 111 in the case of performing the neutralization of the edge ring E included in Example 2 of the processing sequence.

In Example 1 of the processing sequence described above, in step S4, the edge ring E is neutralized in a state where no plasma is generated in the chamber 100.

In contrast, in Example 2, as shown in FIG. 11, after steps S1 to S3 of Example 1 of the processing sequence described above are performed in that order, the following step S11 is performed instead of step S4.

In step S11, a reverse polarity voltage is applied to the electrode 111 of the electrostatic chuck 104 for the predetermined period of time T2 in a state where plasma is generated by injecting a gas from the upper electrode 102 into the chamber 100.

Specifically, for example, first, a predetermined plasma generating gas (e.g., oxygen gas) is supplied at a predetermined flow rate from the gas supply part 140 to the processing space 100*s* via the upper electrode 102, and the exhaust system 160 starts to control the exhaust operation such that a pressure in the chamber 100 becomes a target pressure.

Then, after the predetermined standby time T1 elapses and the chamber 100 is maintained in an atmosphere of the predetermined gas, the RF power supply part 150 supplies the high frequency power HF for plasma generation to the lower electrode 103, for example, thereby generating plasma. Further, although an example in which the high frequency power HF for plasma generation is supplied to the lower electrode 103 has been described, the present disclosure is not limited thereto, and the high frequency power HF may be supplied to the upper electrode 102. In addition, the application of the voltage of the polarity opposite to that in the idle mode in step S3 to the electrode 111 is started. For example, the absolute value of the voltage of the polarity opposite to that in the idle mode, which is applied in step S11, may be less than or equal to the absolute value of the voltage applied in the idle mode.

When the predetermined period of time T2 elapses from the start of application, the application to the electrode 111 is stopped. Further, the supply of the high frequency power HF from the RF power supply part 150 and the supply of the plasma generating gas via the upper electrode 102 are stopped. Further, as in step S4, the exhaust of the chamber 100 by the exhaust system 160 may be continued or stopped.

Further, also in step S11, as in step S4, the exhaust through the gas injection holes 104*c* is performed without injecting the heat transfer gas through the gas injection holes 104*c*.

After step S11, the process subsequent to step S5 of Example 1 of the processing sequence is performed.

When a reverse polarity voltage is applied to the electrode 111 of the electrostatic chuck 104 in a state where plasma is generated as in Example 2, the plasma contains a large amount of charges of the polarity opposite to that of the portion P2 of the edge ring E on the opposite side to the electrostatic chuck 104 side, so that the edge ring E is easily neutralized. In other words, according to Example 2, the edge ring E can be neutralized in a short period of time.

Modifications of Examples 1 and 2 of Processing Sequence

Unlike Examples 1 and 2 of the processing sequence, the edge ring E may be neutralized while injecting the heat transfer gas through the gas injection holes 104*c* without exhausting the gap between the edge ring E and the ring placing surface through the gas injection holes 104*c*.

In the above examples, in the plasma processing of step S1, a voltage of a polarity different from the first polarity applied to the electrode 111 of the electrostatic chuck 104 in the neutralization process of the edge ring E in step S3 is applied to the electrode 111. However, a voltage of the same polarity as the first polarity may be applied to the electrode 111.

Further, unlike the above examples, in the plasma processing in step S1, voltages of the same polarity may be applied to the electrodes 111*a* and 111*b*. In the idle mode in step S3, voltages of different polarities may be applied thereto. In the neutralization of the edge ring E in step S4, voltages of different polarities opposite to those in the idle mode in step S3 may be applied thereto. Specifically, in the plasma processing in step S1, a common positive or negative voltage may be applied to both the electrodes 111*a* and 111*b*. In the idle mode in step S3, one of the positive voltage and the negative voltage may be applied to the electrode 111*a* and the other may be applied to the electrode 111*b*. In the neutralization of the edge ring E in step S4, voltages of polarities opposite to that in the idle mode in step S3 may be applied to the electrodes 111*a* and 111*b*.

Further, in the plasma processing in step S1, the idle mode in step S3, and the neutralization of the edge ring E in step S4, a voltage of a common polarity may be applied to both electrodes 111*a* and 111*b*. At the same time, the polarities of the voltages applied in the plasma processing in step S1 and the idle mode in step S3 may be different from those in the neutralization of the edge ring E in step S4. Specifically, in the plasma processing in step S1, a common positive or negative voltage may be applied to both electrodes 111*a* and 111*b*. In the idle mode in step S3, a voltage of a common polarity that is the same as that in step S1 may be applied to both electrodes 111*a* and 111*b*. In the neutralization of the edge ring E in step S4, a voltage of a common polarity different from that in step S1 may be applied to both electrodes 111*a* and 111*b*.

Example 3 of Processing Sequence

Figure 13:
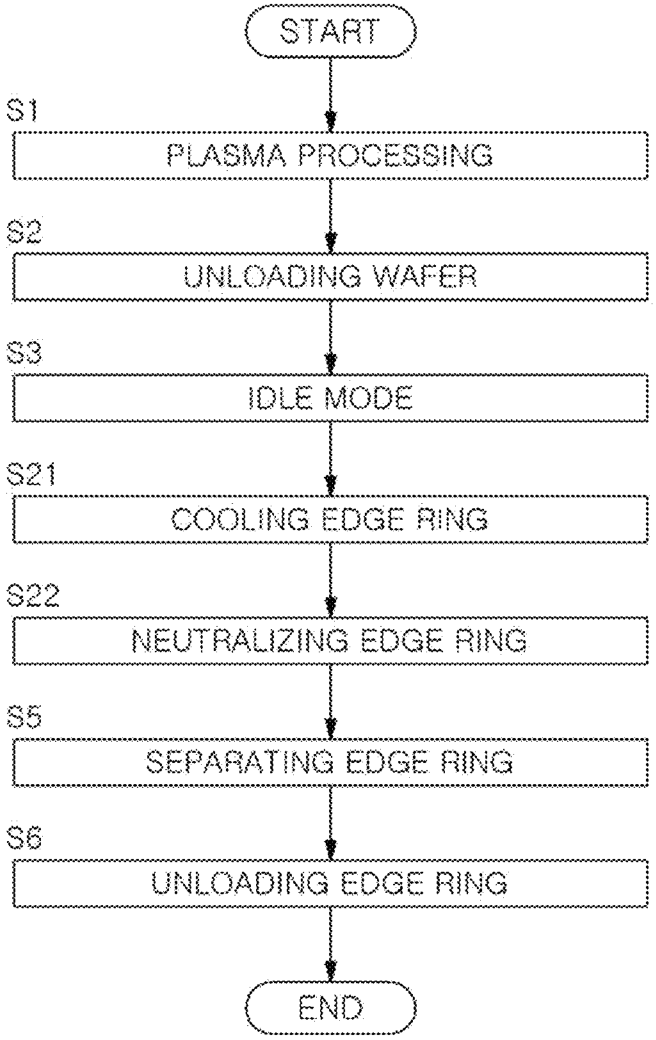
FIG. 13 is a flowchart showing Example 3 of the processing sequence including the edge ring separation sequence.

FIG. 13 is a flowchart showing Example 3 of the processing sequence including the sequence for separating the edge ring E from the processing module 60.

In Example 3, as shown in FIG. 13, after steps S1 to S3 of Example 1 of the processing sequence described above are performed in that order, the edge ring E is cooled (step S21).

The cooling of the edge ring E in step S21 may be performed in any manner as long as the edge ring E is cooled to a predetermined temperature or lower after the plasma processing in step S1 and before the transfer of the edge ring E to the transfer module 50 in step S6.

Specifically, the process of cooling the edge ring E in step S21 is a process of maintaining the edge ring E placed on the ring placing surface for a predetermined period of time before the edge ring E is neutralized in step S22 to be described later, i.e., before the edge ring E is separated from the ring placing surface by the lifter 108 or the like in step S5.

The process of cooling the edge ring E in step S21 may be a process of maintaining the edge ring E placed on the ring placing surface until the measurement result of the edge ring E by a temperature sensor (not shown) becomes lower than or equal to a predetermined temperature before step S21. In this case, the temperature sensor is provided in the processing module 60.

After the edge ring E is cooled in step S21, the edge ring E is neutralized (step S22).

The method of neutralizing the edge ring E in step S22 may be the same as step S4 included in Example 1 of the processing sequence, or may be a known method.

After step S22, steps S5 and S6 of Example 1 of the processing sequence are performed in that order.

<Main Effects of Example 3 of Processing Sequence>

In Example 3 of the processing sequence, a process of performing plasma processing on the wafer W placed on the wafer placing surface in a state where a voltage is applied to the electrode 111 of the electrostatic chuck 104 and the edge ring E is electrostatically attracted to the ring placing surface is performed and, then, a process of transferring the wafer W from the chamber 100 to the transfer module 50 is performed. Then, in Example 3 of the processing sequence, a process of neutralizing the edge ring E, a process of separating the edge ring E from the ring placing surface by the lifting mechanism including the lifters 108, and a process of transferring the edge ring E from the chamber 100 to the transfer module 50 by the transfer robot 70 are performed. Further, Example 3 of the processing sequence example 3 further includes a process of cooling the edge ring E to a predetermined temperature or lower between the process of performing plasma processing and the process of transferring the edge ring E to the transfer module 50 by the transfer robot 70. Therefore, damage to the transfer arm 71 of the transfer robot 70 caused by the high-temperature edge ring E can be suppressed. Specifically, for example, it is possible to suppress damage to the resin portion of the transfer arm 71 of the transfer robot 70 that is brought into contact with the edge ring E. Further, if the edge ring E reaches a high temperature, the electrostatic chuck 104 or the edge ring E may be damaged by the contact between with the edge ring E and the electrostatic chuck 104 due to the thermal expansion of the edge ring E when the edge ring E is lifted from the ring placing surface. In the present embodiment, such damage can be suppressed.

Modification of Example 3 of Processing Sequence

The process of cooling the edge ring E may include a process of supplying a gas into the chamber 100 at a second gas flow rate greater than the first gas flow rate, which is the flow rate of the gas supplied into the chamber 100 during the plasma processing, between the process of performing the plasma processing in step S1 and the process of neutralizing the edge ring E in step S22. In the case of performing the processing sequence of this modification, the process of maintaining a state in which the edge ring E is placed on the ring placing surface in Example 3 of the processing sequence may be omitted.

Alternatively, instead of or in addition to this modification, the process of cooling the edge ring E may include a process of supplying a gas into the chamber 100 at the second flow rate between the process of neutralizing the edge ring E in step S22 and the process of separating the edge ring E from the ring placing surface in step S5.

Further, instead of or in addition to the process of supplying a gas into the chamber 100 at the second flow rate, the process of cooling the edge ring E may include a process of supplying a temperature control fluid at a second temperature lower than the first temperature, which is the temperature of the temperature control fluid supplied during the plasma processing, to the channel 109 of the wafer support table 101 after the process of performing plasma processing in step S1. Also in the case of performing the processing sequence of this modification, the process of maintaining a state in which the edge ring E is placed on the ring placing surface in Example 3 of the processing sequence may be omitted.

Further, when the temperature control fluid of the second temperature is supplied to the channel 109 of the wafer support table 101 as described above, a heat transfer gas may be supplied from the gas injection holes 104*c* to the gap between the peripheral upper surface 104*b* and the rear surface of the edge ring E placed on the peripheral upper surface 104*a* of the electrostatic chuck 104. As a result, the flow of heat from the edge ring E to the wafer support table 101 is promoted and, thus, the edge ring E can be cooled efficiently.

Modification of Examples 1 to 3 of Processing Sequence

In the case of performing Examples 1 to 3 of the processing sequence, a process of removing reaction by-products adhered to the edge ring E, i.e., a process of cleaning the edge ring E, may be performed during a period between the process of neutralizing the edge ring E and the process of transferring the edge ring E to the transfer module 50.

In the cleaning process, specifically, a gas is supplied from the upper electrode 102 into the chamber 100 to generate plasma, and the reaction by-products adhered to the edge ring E are removed by the plasma.

More specifically, in the cleaning step, for example, in a state where no wafer W is placed on the electrostatic chuck 104, a predetermined cleaning gas is injected from the gas supply part 140 into the processing space 100*s* via the upper electrode 102. Further, in a state where no wafer W is placed on the electrostatic chuck 104, the high frequency power HF for plasma generation is supplied from the RF power supply part 150 to the lower electrode 103, for example, thereby generating plasma of the cleaning gas. Although an example in which the high frequency power HF for plasma generation is supplied to the lower electrode 103 has been described, the present disclosure is not limited thereto, and the high frequency power HF may be supplied to the upper electrode 102. The reaction by-products adhered to the edge ring E are removed by the plasma of the cleaning gas. As a result, it is possible to prevent the reaction products from adversely affecting the edge ring E when the edge ring E is unloaded.

The cleaning makes it possible to remove reaction by-products adhered to the electrostatic chuck 104.

The cleaning process may be performed in a state where the edge ring E is lifted by the lifting mechanism including the lifters 108 and separated from the ring placing surface. As a result, the reaction by-products can be more appropriately removed from the inner peripheral surface of the edge ring E and the outer peripheral surface of the central portion of the electrostatic chuck 104.

Further, a DC voltage may be supplied to the lower electrode 103 to generate plasma of the cleaning gas.

Further, the cleaning process may be performed in a state where a dummy wafer W is placed on the electrostatic chuck 104.

Another Modification of Examples 1 and 2 of Processing Sequence

In Examples 1 and 2 of the processing sequence, the edge ring E may be cooled in the same manner as that in Example 3 of the processing sequence.

<Modification of Plasma Processing Apparatus>

In the above example, the exhaust through the gas injection holes 104*c* serving as exhaust holes, and the exhaust of the chamber 100, i.e., the processing space 100*s*, are performed by a common exhaust system 160. However, they may be performed by different exhaust systems.

Further, the exhaust holes and the gas injection holes 104*c* may be provided separately. In other words, an exhaust path including the exhaust holes and a supply path including the gas injection holes 104*c* may be provided separately.

In addition to the edge ring E, a covering ring may be placed on the wafer support table used in the plasma processing apparatus to cover the outer surface of the edge ring. The technique of the present disclosure can also be applied to this case.

Figure 14:
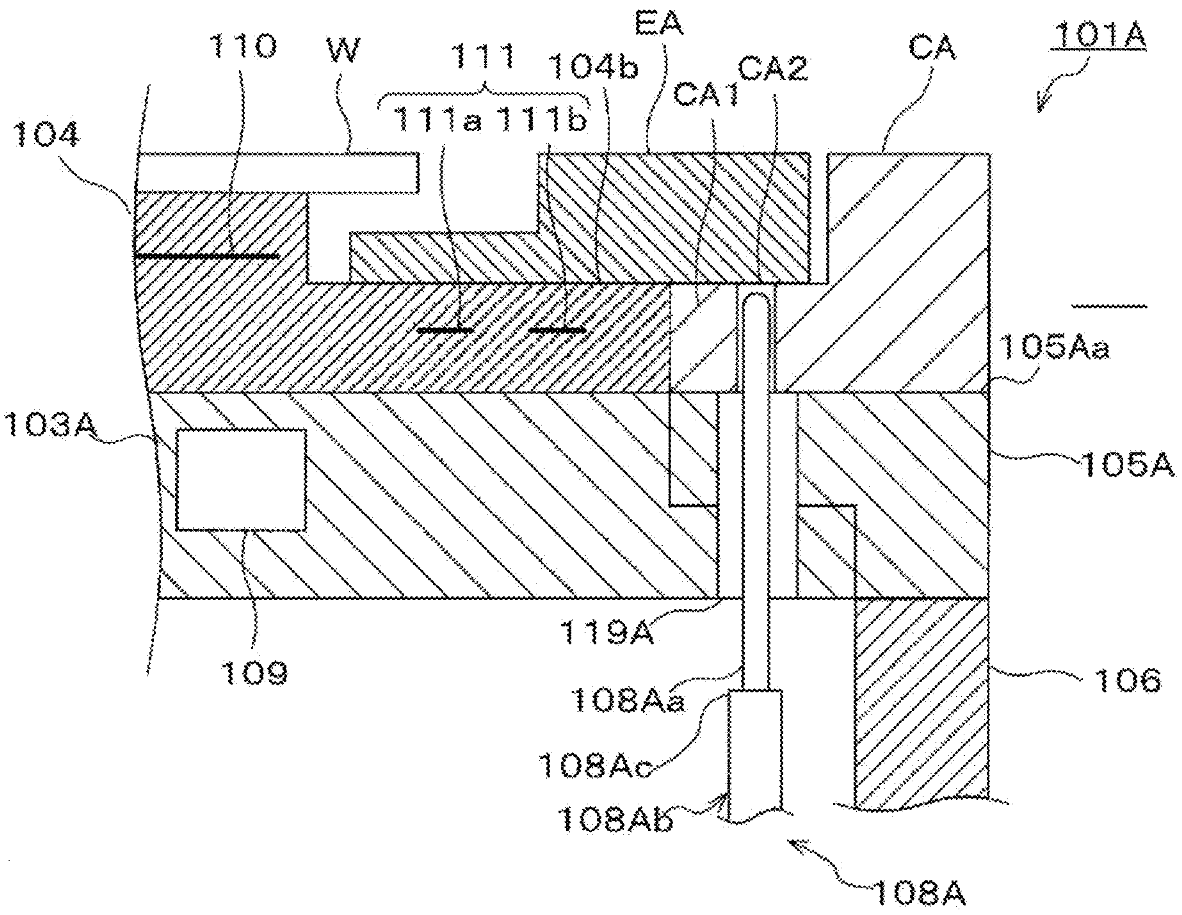
FIG. 14 is a partially enlarged view for explaining an example of the wafer support table on which a covering ring in addition to the edge ring is placed.

FIG. 14 is a partially enlarged view for explaining an example of a wafer support table on which a covering ring CA, in addition to the edge ring EA, is placed.

Hereinafter, differences between a wafer support table 101A shown in FIG. 14 and the wafer support table 101 shown in FIG. 2 and the like will be mainly described.

The wafer support table 101A shown in FIG. 14 includes the electrostatic chuck 104, the insulator 106, and the lifters 107, similarly to the wafer support table 101 shown in FIG. 2 and the like. The wafer support table 101A further includes a lower electrode 103A, a support 105A, and lifters 108A. The wafer support table 101A is configured to support both the edge ring EA and the covering ring CA.

The lower outer periphery of the lower electrode 103A and the upper inner periphery of the support 105A are formed to overlap in plan view. Further, the lifters 108A are inserted into the lower electrode 103A and the support 105A. Insertion holes 119A are provided. The insertion holes 119A are formed to extend downward from the upper surface 105Aa of the inner periphery of the support 105A to the bottom surface of the lower outer periphery of the lower electrode 103A.

The electrostatic chuck 104 is provided to be placed on the lower electrode 103A. The edge ring EA is placed on the peripheral upper surface 104*a* of the electrostatic chuck 104, and the covering ring CA is placed on the upper surface 105Aa of the support 105A. The upper surface 105Aa of the support 105A and the upper surface of the lower electrode 103A have substantially the same height.

The edge ring EA is formed to have an outer diameter greater than that of the electrostatic chuck 104. Therefore, when the edge ring EA is placed on the peripheral upper surface 104*a* of the electrostatic chuck 104, the peripheral portion of the edge ring EA protrudes from the peripheral portion of the electrostatic chuck 104.

The covering ring CA is a member disposed to cover the outer surface of the edge ring EA. Similarly to the edge ring EA, the covering ring CA is formed in an annular shape in plan view. In one embodiment, the covering ring CA has protruding portions CA1 protruding radially inwardly at the bottom portion thereof.

Further, the covering ring CA has through-holes CA2 through which the lifters 108A are inserted at positions corresponding to the lifters 108A. The through-holes CA2 penetrate from the bottom surface of the covering ring CA to the edge ring EA. The through-holes CA2 are formed in portions (specifically, for example, the protruding portions CA1) that overlap the inner peripheral portion of the covering ring CA that overlaps the peripheral portion of the edge ring EA in plan view.

The lifters 108A are configured to be able to protrude from and retract below the upper surface 105Aa of the inner peripheral portion of the support 105A, and are raised and lowered so that the amount of protrusion and retraction with respect to the upper surface 105Aa can be adjusted. Specifically, the lifters 108A are configured to be able to protrude from positions on the upper surface 105Aa of the inner periphery of the support 105A that overlap the edge ring EA and the covering ring CA in plan view. The insertion holes 119A through which the lifters 108A are inserted are formed at positions overlapping the edge ring EA and the covering ring CA in plan view.

Similarly to the lifters 108 shown in FIG. 3 and the like, three or more lifters 108A are provided at intervals along the circumferential direction of the electrostatic chuck 104.

Further, each of the lifters 108A has a first engagement portion 108Aa and a second engagement portion 108Ab.

The lifter 108A has the first engagement portion 108Aa at the upper portion thereof. The first engagement portion 108Aa is formed in a columnar shape, for example, except the upper end (i.e., the tip end) thereof. The upper end thereof is formed in a hemispherical shape. The first engagement portion 108Aa protrudes upward from the through-hole CA2 of the covering ring CA, and is engaged with the edge ring E. When the lifters 108A are raised, the first engagement portion 108Aa passes through the through-holes CA2 of the covering ring CA and is brought into contact with the bottom surface of the edge ring EA, thereby supporting the edge ring EA from the bottom surface thereof.

The second engagement portion 108Ab is located below the first engagement portion 108Aa, and is engaged with the covering ring CA. The second engagement portion 108Ab is brought into contact with the bottom surface of the covering ring CA without passing through the through-hole CA2 of the covering ring CA, thereby supporting the covering ring CA from the bottom surface thereof.

Further, the second engagement portion 108Ab is connected to the base end side of the first engagement portion 108Aa along the axial direction of the lifter 108A. In addition, the second engagement portion 108Ab has a protruding portion 108Ac protruding outward from the outer periphery of the first engagement portion 108Aa at a position connected to the first engagement portion 108Aa.

The specific shapes of the first engagement portion 108Aa, the second engagement portion 108Ab, and the protruding portion 108Ac are not particularly limited. For example, the first engagement portion 108Aa, the second engagement portion 108Ab, and the protruding portion 108Ac may each be a cylindrical member, and may be coaxial with each other.

The actuator 116 described above raises and lowers the lifters 108A of which second engagement portion 108Ab is engaged with the covering ring CA, thereby raising and lowering the covering ring CA.

Further, the actuator 116 raises and lowers the lifters 108 of which first engagement portion 108Aa is engaged with the edge ring E, thereby raising and lowering the edge ring E.

In the case of using the wafer support table 101A, the edge ring EA may be separated alone or may be separated together with the covering ring CA.

In the case of separating the edge ring EA alone, the process of separating the edge ring EA from the ring placing surface by the lifting mechanism including the lifters 108A and the process of transferring the edge ring EA to the transfer module 50 are performed as follows, for example.

In the process of separating the edge ring EA from the ring placing surface, for example, all the lifters 108 are raised. As a result, the edge ring E is transferred from the ring placing surface including the peripheral upper surface 104*a* of the electrostatic chuck 104 to the first engagement portions 108Aa of the lifters 108 that have passed through the insertion holes 119A and the through-holes CA2 of the covering ring CA. The lifters 108A are raised to a level at which the covering ring CA is not transferred to the second engagement portions 108Ab of the lifters 108A, and is raised until the top portions of the first engagement portions 108Aa reach a predetermined height. Here, the predetermined height indicates a height at which the transfer arm 71 does not interfere with the edge ring E and the covering ring CA when the transfer arm 71 is inserted into or removed from the space between the covering ring CA placed on the support 105A and the edge ring EA supported by the first engagement portion 108Aa.

In the process of transferring the edge ring EA to the transfer module 50, for example, the transfer arm 71 is first inserted into the chamber 100 through a loading/unloading port (not shown). Then, the transfer arm 71 is moved between the covering ring CA placed on the support 105A and the edge ring EA supported by the first engagement portions 108Aa of the lifters 108A.

Next, all the lifters 108 are lowered, and the edge ring EA is transferred from the first engagement portions 108Aa of the lifters 108A to the transfer arm 71. Then, the transfer arm 71 is removed from the chamber 100, and the edge ring E is transferred to the transfer module 50. The transferred edge ring E is loaded into the storage module 61.

In the case of separating the edge ring EA together with the covering ring CA, the process of separating the edge ring EA from the ring placing surface by the lifting mechanism including the lifters 108A and the process of transferring the edge ring EA to the transfer module 50 are performed as follows, for example.

In the process of separating the edge ring EA from the ring placing surface, all the lifters 108 are raised, for example. As a result, the edge ring E is transferred from the ring placing surface including the peripheral upper surface 104*a* of the electrostatic chuck 104 to the first engagement portions 108Aa of the lifters 108 that have passed through the insertion holes 119A and the through-holes CA2 of the covering ring CA. Thereafter, the lifting of all the lifters 108 continues, and the covering ring CA is transferred from the upper surface 105Aa of the support 105A to the second engagement portions 108Ab of the lifters 108A. In this case, the lifters 108 are raised until the top portions of the second engagement portions 108*b* reach a predetermined height. Here, the predetermined height indicates a height at which the transfer arm 71 does not interfere with the covering ring CA or the like when the transfer arm 71 is inserted into and removed from the space between the central upper surface 104*a* of the electrostatic chuck 104 and the covering ring CA supported by the second engagement portions 108Ab.

In the process of transferring the edge ring EA to the transfer module 50, for example, first, the transfer arm 71 is inserted into the chamber 100 through a loading/unloading port (not shown). Then, the transfer arm 71 is moved to the space between the central upper surface 104*a* of the electrostatic chuck 104 and the covering ring CA supported by the second engagement portions 108Ab of the lifters 108.

Next, all the lifters 108 are lowered, and the covering ring CA is transferred from the second engagement portions 108Ab of the lifters 108A to the transfer arm 71. Thereafter, the lowering of all the lifters 108A continues, and the edge ring EA is transferred from the first engagement portions 108Aa of the lifters 108 to the covering ring CA supported by the transfer arm 71.

Then, the transfer arm 71 is removed from the chamber 100, and the covering ring CA supporting the edge ring E is transferred to the transfer module 50. The covering ring CA supporting the transferred edge ring E is loaded into the storage module 61.

The edge ring may be configured as follows. In other words, even if the edge ring is misaligned with respect to the lifters immediately after it is transferred to and from the lifters, the edge ring may be moved (specifically, may slide on the lifters) by its own weight or the like and positioned with respect to the lifters.

Figure 15:
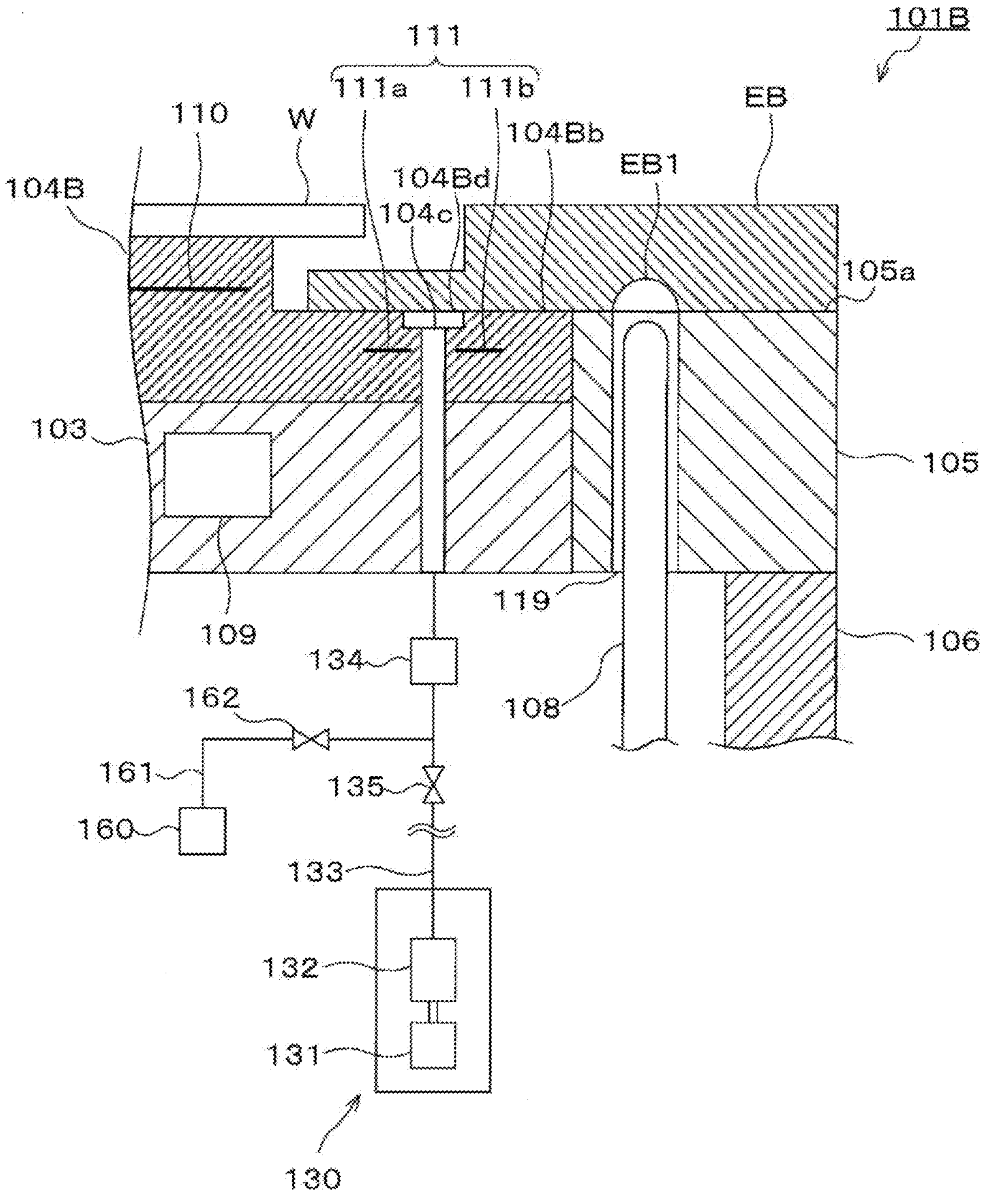
FIG. 15 is a partially enlarged view for explaining another example of an electrostatic chuck.

An edge ring EB shown in FIG. 15 has recesses EB1 for performing positioning with respect to the lifters 108 as described above at positions corresponding to the lifters 108 on the bottom surface thereof. The recesses EB1 have a flare shape that expands downward. If the edge ring EB is misaligned with respect to the lifters 108 immediately after it is transferred to and from the lifters 108, the edge ring E moves with respect to the lifters 10A so that the upper ends of the lifters 108 slide along the concave surfaces forming the recesses EB1. Therefore, the edge ring EB can be positioned with respect to the plurality of lifters 108.

Further, the edge ring EA shown in FIG. 14 may also have a recess similar to the recess EB1.

Moreover, similarly to the wafer support table 101B shown in FIG. 15, a groove 104Bd that is recessed downward may be formed in an annular shape in plan view on the peripheral upper surface 104Bb of the electrostatic chuck 104B. In addition, the gas injection hole 104*c* may be formed in the groove 104Bd. Specifically, one end of the gas injection hole 104*c* may be opened in the groove 104Bd.

Also in the case of using the wafer support table 101A shown in FIG. 14, a groove similar to the groove 104Bd may be formed on the peripheral upper surface of the electrostatic chuck.

It should be noted that the above-described embodiments are illustrative in all respects and are not restrictive. The above-described embodiments may be omitted, replaced, or changed in various forms without departing from the scope of the appended claims and the gist thereof. For example, the components of the above-described embodiments can be randomly combined. The effects of the components for arbitrary combination can be obtained from the corresponding arbitrary combination, other effects apparent to those skilled in the art can also be obtained.

Further, the effects described in the present specification are merely explanatory or exemplary, and are not restrictive. In other words, in the technique related to the present disclosure, other effects apparent to those skilled in the art can be obtained from the description of the present specification in addition to the above-described effects or instead of the above-described effects.

Further, the following configuration examples are also included in the technical scope of the present disclosure.

(1) A substrate processing system comprising:

a plasma processing apparatus;

a depressurization transfer device connected to the plasma processing apparatus and having a transfer robot configured to transfer a substrate and an edge ring; and a controller;

wherein the plasma processing apparatus includes:

a depressurizable processing chamber;

a substrate support table disposed in the processing chamber, and including an electrostatic chuck having a substrate placing surface, a ring placing surface on which the edge ring is placed to surround the substrate placing surface, and an electrode that attracts the edge ring on the ring placing surface;

a lifting mechanism configured to raise and lower the edge ring with respect to the ring placing surface;

a gas supply part configured to supply a gas into the processing chamber; and a plasma generating part configured to generate plasma in the processing chamber, and wherein the controller controls following steps to be performed in following order:

(a) performing plasma processing on the substrate and, then, applying a voltage of a first polarity to the electrode;

(b) neutralizing the edge ring, by applying a voltage of a second polarity different from the first polarity applied to the electrode in the step (a) to the electrode while supplying the gas from the gas supply part into the processing chamber, and stopping the application of the voltage to the electrode after a predetermined period of time elapses;

(c) separating the edge ring from the ring placing surface by the lifting mechanism; and (d) transferring the edge ring from the processing chamber to the depressurization pressure transfer device by the transfer robot.

(2) The substrate processing system of (1), wherein the plasma processing apparatus further includes a supply path that supplies a gas to a gap between a rear surface of the edge ring and the ring placing surface, and the step (b) is performed while exhausting the supply path.

(3) The substrate processing system of (1) or (2), wherein a voltage having a different polarity from the first polarity or the same polarity as the first polarity is applied to the electrode during the plasma processing.

(4) The substrate processing system of any one of (1) to (3), wherein:

the electrode has a first electrode and a second electrode formed at different positions, voltages of different polarities are applied to the first electrode and the second electrode during the plasma processing, in the step (a), voltages of the same polarity are applied to the first electrode and the second electrode, and in the step (b), voltages of the same polarity, which is different from the polarity in the step (a), are applied to the first electrode and the second electrode.

(5) The substrate processing system of any one of (1) to (3), wherein:

the electrode include a first electrode and a second electrode formed at different positions, voltages of the same polarity are applied to the first electrode and the second electrode during the plasma processing, in the step (a), voltages of different polarities are applied to the first electrode and the second electrode, and in the step (b), voltages of different polarities, which are opposite to the polarities in the step (a), are applied to the first electrode and the second electrode.

(6) The substrate processing system of any one of (1) to (4), wherein the predetermined period of time is in the range of 2 seconds to 40 seconds.

(7) The substrate processing system of any one of (1) to (6), wherein in the step (b), the voltage of the second polarity is applied to the electrode in a state where plasma is generated by supplying the gas from the gas supply part into the processing chamber.

(8) The substrate processing system of any one of (1) to (7), wherein the controller further controls a step of:

(e) removing reaction by-products adhered to the edge ring, by supplying the gas from the gas supply part into the processing chamber and generating plasma during a period between the step (b) and the step (d).

(9) The substrate processing system of (8), wherein the step (e) is performed in a state where the edge ring is raised and separated from the ring placing surface.

(10) The substrate processing system of any one of (1) to (9), wherein the absolute value of the voltage applied to the electrode in the step (b) is less than the absolute value of the voltage applied to the electrode in the step (a).

(11) A substrate processing system comprising:

a plasma processing apparatus;

a depressurization transfer device connected to the plasma processing apparatus and having a transfer robot configured to transfer a substrate and an edge ring; and a controller, wherein the plasma processing apparatus includes:

a depressurizable processing chamber;

a substrate support table disposed in the processing chamber, and including an electrostatic chuck having a substrate placing surface, a ring placing surface on which the edge ring is placed to surround the substrate placing surface, and an electrode that attracts the edge ring on the ring placing surface;

a lifting mechanism configured to raise and lower the edge ring with respect to the ring placing surface;

a gas supply part configured to supply a gas into the processing chamber;

a plasma generating part configured to generate plasma in the processing chamber; and a cooling part configured to cooling the edge ring, wherein the controller controls following steps to be performed in the following order:

(a) performing the plasma processing on the substrate placed on the substrate placing surface in a state where a voltage is applied to the electrode of the electrostatic chuck and the edge ring is electrostatically attracted to the ring placing surface;

(b) transferring the substrate from the processing chamber to the depressurization transfer device;

(c) neutralizing the edge ring;

(d) separating the edge ring from the ring placing surface by the lifting mechanism; and (e) transferring the edge ring from the processing chamber to the depressurization transfer device by the transfer robot, and wherein the controller further controls a step of:

(f) cooling the edge ring so that the edge ring reaches a predetermined temperature or lower after the step (a) and before the step (e).

(12) The substrate processing system of (11), wherein:

the cooling part includes the gas supply part, in the step (a), the gas is supplied into the processing chamber at a first gas flow rate, and in the step (f), the gas is controlled to be supplied into the processing chamber at a second gas flow rate, which is greater than the first gas flow rate, after the step (a) and before the step (c) and/or after the step (c) and before the step (d).

(13) The substrate processing system of (11) or (12), wherein:

the cooling part includes a channel for a temperature control fluid provided in the substrate support table, in the step (a), a temperature control fluid of a first temperature is supplied to the channel, and in the step (f), a temperature control fluid of a second temperature lower than the first temperature is supplied to the channel after the step (a).

(14) The substrate processing system of any one of (11) to (13), wherein the controller further controls a step of:

(g) supplying the gas from the gas supply part into the processing chamber to generate plasma and remove reaction by-products adhered to the edge ring, during a period after the step (c) and before the step (e).

(15) The substrate processing system of (14), wherein the step (g) is performed in a state where the edge ring is raised and separated from the ring placing surface.

The invention claimed is:

1. A substrate processing system comprising:

a plasma processing apparatus;

a depressurization transfer device connected to the plasma processing apparatus and having a transfer robot configured to transfer a substrate and an edge ring; and a controller;

wherein the plasma processing apparatus includes:

a depressurizable processing chamber;

a substrate support table disposed in the processing chamber, and including an electrostatic chuck having a substrate placing surface, a ring placing surface on which the edge ring is placed to surround the substrate placing surface, and an electrode that attracts the edge ring on the ring placing surface;

a lifting mechanism configured to raise and lower the edge ring with respect to the ring placing surface;

a gas supply part configured to supply a gas into the processing chamber; and a plasma generating part configured to generate plasma in the processing chamber, and wherein the controller controls following steps to be performed in following order:

(a) performing plasma processing on the substrate and, then, applying a voltage of a first polarity to the electrode;

(b) neutralizing the edge ring, by applying a voltage of a second polarity different from the first polarity applied to the electrode in the step (a) to the electrode while supplying the gas from the gas supply part into the processing chamber, and stopping the application of the voltage to the electrode after a predetermined period of time elapses;

(c) separating the edge ring from the ring placing surface by the lifting mechanism; and (d) transferring the edge ring from the processing chamber to the depressurization pressure transfer device by the transfer robot.

2. The substrate processing system of claim 1, wherein the plasma processing apparatus further includes a supply path that supplies a gas to a gap between a rear surface of the edge ring and the ring placing surface, and the step (b) is performed while exhausting the supply path.

3. The substrate processing system of claim 1, wherein a voltage having a different polarity from the first polarity or the same polarity as the first polarity is applied to the electrode during the plasma processing.

4. The substrate processing system of claim 1, wherein:

the electrode has a first electrode and a second electrode formed at different positions, voltages of different polarities are applied to the first electrode and the second electrode during the plasma processing, in the step (a), voltages of the same polarity are applied to the first electrode and the second electrode, and in the step (b), voltages of the same polarity, which is different from the polarity in the step (a), are applied to the first electrode and the second electrode.

5. The substrate processing system of claim 1, wherein:

the electrode include a first electrode and a second electrode formed at different positions, voltages of the same polarity are applied to the first electrode and the second electrode during the plasma processing, in the step (a), voltages of different polarities are applied to the first electrode and the second electrode, and in the step (b), voltages of different polarities, which are opposite to the polarities in the step (a), are applied to the first electrode and the second electrode.

6. The substrate processing system of claim 1, wherein the predetermined period of time is in the range of 2 seconds to 40 seconds.

7. The substrate processing system of claim 1, wherein in the step (b), the voltage of the second polarity is applied to the electrode in a state where plasma is generated by supplying the gas from the gas supply part into the processing chamber.

8. The substrate processing system of claim 1, wherein the controller further controls a step of:

(e) removing reaction by-products adhered to the edge ring, by supplying the gas from the gas supply part into the processing chamber and generating plasma during a period between the step (b) and the step (d).

9. The substrate processing system of claim 8, wherein the step (e) is performed in a state where the edge ring is raised and separated from the ring placing surface.

10. The substrate processing system of claim 1, wherein the absolute value of the voltage applied to the electrode in the step (b) is less than the absolute value of the voltage applied to the electrode in the step (a).

11. A substrate processing system comprising:
a plasma processing apparatus;
a depressurization transfer device connected to the plasma processing apparatus and having a transfer robot configured to transfer a substrate and an edge ring; and
a controller,
wherein the plasma processing apparatus includes:
a depressurizable processing chamber;
a substrate support table disposed in the processing chamber, and including an electrostatic chuck having a substrate placing surface, a ring placing surface on which the edge ring is placed to surround the substrate placing surface, and an electrode that attracts the edge ring on the ring placing surface;
a lifting mechanism configured to raise and lower the edge ring with respect to the ring placing surface;
a gas supply part configured to supply a gas into the processing chamber;
a plasma generating part configured to generate plasma in the processing chamber; and
a cooling part configured to cooling the edge ring,
wherein the controller controls following steps to be performed in the following order:
(a) performing the plasma processing on the substrate placed on the substrate placing surface in a state where a voltage is applied to the electrode of the electrostatic chuck and the edge ring is electrostatically attracted to the ring placing surface;
(b) transferring the substrate from the processing chamber to the depressurization transfer device;
(c) neutralizing the edge ring;
(d) separating the edge ring from the ring placing surface by the lifting mechanism; and
(e) transferring the edge ring from the processing chamber to the depressurization transfer device by the transfer robot, and
wherein the controller further controls a step of:
(f) cooling the edge ring so that the edge ring reaches a predetermined temperature or lower after the step (a) and before the step (e).

12. The substrate processing system of claim 11, wherein:
the cooling part includes the gas supply part,
in the step (a), the gas is supplied into the processing chamber at a first gas flow rate, and
in the step (f), the gas is controlled to be supplied into the processing chamber at a second gas flow rate, which is greater than the first gas flow rate, after the step (a) and before the step (c) and/or after the step (c) and before the step (d).

13. The substrate processing system of claim 11, wherein:
the cooling part includes a channel for a temperature control fluid provided in the substrate support table,
in the step (a), a temperature control fluid of a first temperature is supplied to the channel, and
in the step (f), a temperature control fluid of a second temperature lower than the first temperature is supplied to the channel after the step (a).

14. The substrate processing system of claim 11, wherein the controller further controls a step of:
(g) supplying the gas from the gas supply part into the processing chamber to generate plasma and remove reaction by-products adhered to the edge ring, during a period after the step (c) and before the step (e).

15. The substrate processing system of claim 14, wherein the step (g) is performed in a state where the edge ring is raised and separated from the ring placing surface.

* * * * *